United States Patent
Okamoto

(10) Patent No.: US 9,231,056 B2
(45) Date of Patent: Jan. 5, 2016

(54) SEMICONDUCTOR DEVICE AND FABRICATION METHOD THEREFOR, AND POWER SUPPLY APPARATUS

(71) Applicant: FUJITSU LIMITED, Kawasaki-shi, Kanagawa (JP)

(72) Inventor: Naoya Okamoto, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/242,186

(22) Filed: Apr. 1, 2014

(65) Prior Publication Data

US 2014/0209861 A1 Jul. 31, 2014

Related U.S. Application Data

(63) Continuation of application No. PCT/JP2011/073607, filed on Oct. 14, 2011.

(51) Int. Cl.
   *H01L 29/06* (2006.01)
   *H01L 29/15* (2006.01)
   (Continued)

(52) U.S. Cl.
   CPC ............... *H01L 29/151* (2013.01); *B82Y 10/00* (2013.01); *H01L 21/0254* (2013.01); *H01L 21/0259* (2013.01); *H01L 21/28264* (2013.01); *H01L 21/8252* (2013.01); *H01L 24/05* (2013.01); *H01L 27/0605* (2013.01); *H01L 27/0629* (2013.01); *H01L 29/0657* (2013.01); *H01L 29/127* (2013.01); *H01L 29/2003* (2013.01); *H01L 29/49* (2013.01); *H01L 29/7827* (2013.01); *H01L 29/812* (2013.01); *H01L 29/872* (2013.01); *H01L 2224/0603* (2013.01); *H01L 2224/32245* (2013.01);
   (Continued)

(58) Field of Classification Search
   CPC ... H01L 29/151; H01L 29/127; H01L 29/812; H01L 29/872; H01L 29/49; H01L 21/0254
   USPC .......................................................... 257/14
   See application file for complete search history.

(56) References Cited

U.S. PATENT DOCUMENTS

| 6,239,033 B1 | 5/2001 | Kawai | |
| 6,294,794 B1 * | 9/2001 | Yoshimura et al. | 257/14 |

(Continued)

FOREIGN PATENT DOCUMENTS

| JP | H10-308560 | 11/1998 |
| JP | H11-45892 | 2/1999 |

(Continued)

OTHER PUBLICATIONS

International Search Report for International Application No. PCT/JP2011/073607 dated Dec. 20, 2011.

(Continued)

*Primary Examiner* — Nicholas Tobergte
(74) *Attorney, Agent, or Firm* — Kratz, Quintos & Hanson, LLP

(57) ABSTRACT

A semiconductor device includes a drift layer having a structure wherein a plurality of quantum dot layers each including a quantum dot containing $In_xGa_{1-x}N$ ($0 \leq x \leq 1$) and a burying layer burying the quantum dot and containing n-type $In_x(Ga_yAl_{1-y})_{1-x}N$ ($0 \leq x \leq 1$, $0 \leq y \leq 1$) are stacked.

20 Claims, 28 Drawing Sheets

(51) Int. Cl.

| | |
|---|---|
| *H01L 29/872* | (2006.01) |
| *H01L 29/812* | (2006.01) |
| *H01L 29/12* | (2006.01) |
| *H01L 29/20* | (2006.01) |
| *H01L 21/8252* | (2006.01) |
| *H01L 27/06* | (2006.01) |
| *H01L 21/28* | (2006.01) |
| *H01L 29/49* | (2006.01) |
| *H01L 29/78* | (2006.01) |
| *H01L 21/02* | (2006.01) |
| *B82Y 10/00* | (2011.01) |
| *H01L 23/00* | (2006.01) |

(52) U.S. Cl.
CPC ............ *H01L 2224/48247* (2013.01); *H01L 2224/48472* (2013.01); *H01L 2224/73265* (2013.01)

(56) References Cited

U.S. PATENT DOCUMENTS

| | | | |
|---|---|---|---|
| 6,468,902 | B2 | 10/2002 | Kawai |
| 6,903,392 | B2 | 6/2005 | Kawai |
| 7,576,393 | B2 | 8/2009 | Ono |
| 8,334,157 | B2 | 12/2012 | Smeeton |
| 2001/0035580 | A1 | 11/2001 | Kawai |
| 2001/0040245 | A1 | 11/2001 | Kawai |
| 2005/0051861 | A1* | 3/2005 | Shi et al. ............... 257/438 |
| 2006/0071218 | A1 | 4/2006 | Takeda |
| 2006/0222028 | A1* | 10/2006 | Hatori et al. ............... 372/45.01 |
| 2007/0001194 | A1 | 1/2007 | Ono |
| 2008/0073716 | A1* | 3/2008 | Yamamoto et al. ........... 257/347 |
| 2009/0045394 | A1 | 2/2009 | Smeeton |
| 2009/0086785 | A1* | 4/2009 | Hatori et al. ............... 372/50.11 |
| 2011/0079767 | A1* | 4/2011 | Senes et al. ................ 257/13 |
| 2011/0146774 | A1* | 6/2011 | Kim et al. ................... 136/255 |
| 2012/0205613 | A1* | 8/2012 | Mi et al. ..................... 257/9 |
| 2013/0122640 | A1* | 5/2013 | Kim et al. ................... 438/94 |
| 2013/0240348 | A1* | 9/2013 | Mi et al. ..................... 204/157.5 |
| 2013/0270517 | A1* | 10/2013 | Nozawa et al. ............... 257/13 |

FOREIGN PATENT DOCUMENTS

| | | |
|---|---|---|
| JP | 11354843 H | 12/1999 |
| JP | H11-354843 | 12/1999 |
| JP | 2002-9083 A1 | 1/2002 |
| JP | 2004-63957 A1 | 2/2004 |
| JP | 2007-12858 A1 | 1/2007 |
| JP | 2007-123731 A1 | 5/2007 |
| JP | 2008-198677 A1 | 8/2008 |
| JP | 2009-10168 A1 | 1/2009 |
| JP | 2009-55016 A1 | 3/2009 |
| JP | 2011-523206 A1 | 8/2011 |
| JP | 2011523206 A | 8/2011 |
| WO | WO 2004/055900 A1 | 7/2004 |

OTHER PUBLICATIONS

Office Action of JP Patent Application 2013-538404 dated Mar. 24, 2015. Relevant translation of the O.A.

* cited by examiner

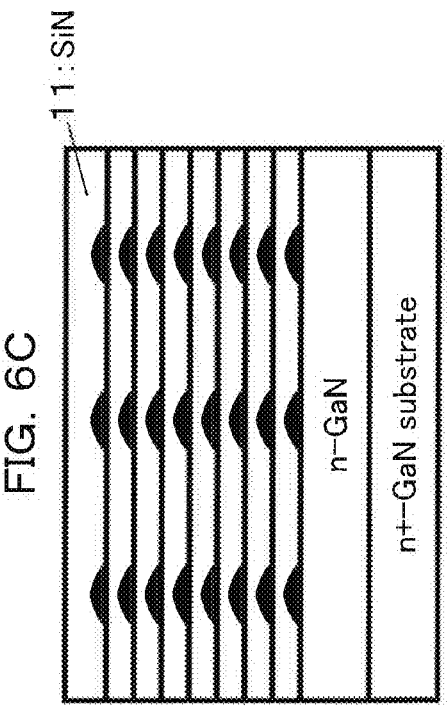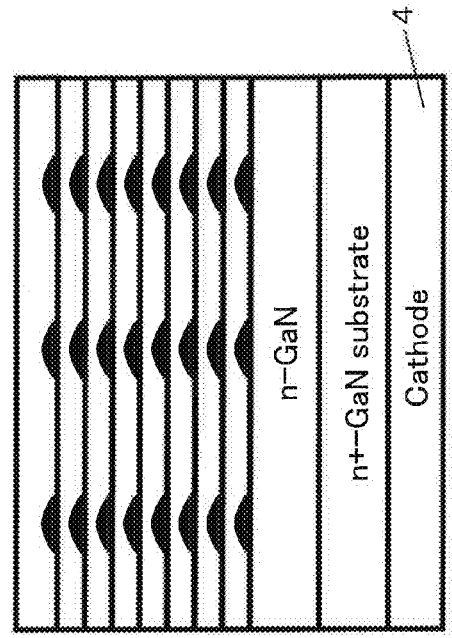

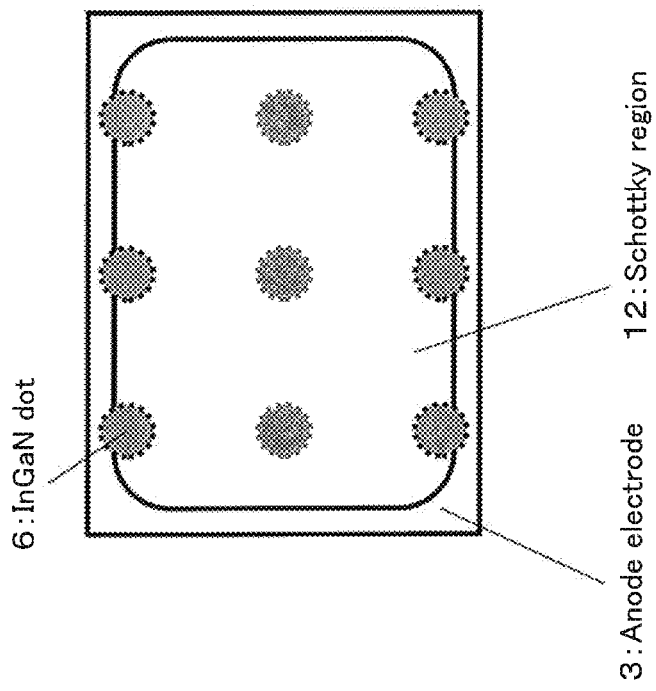
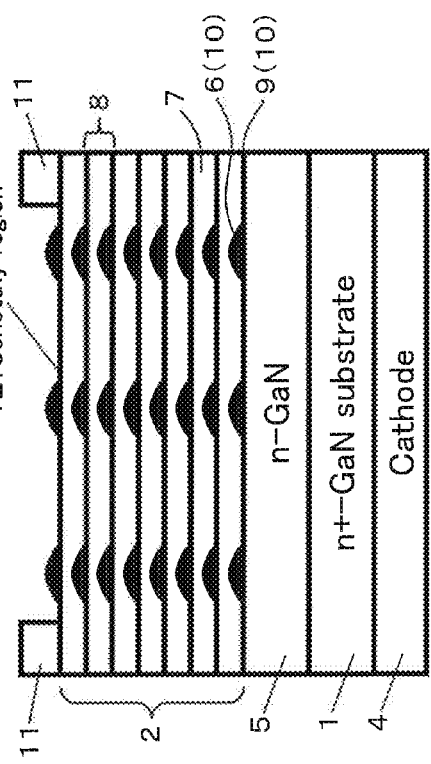
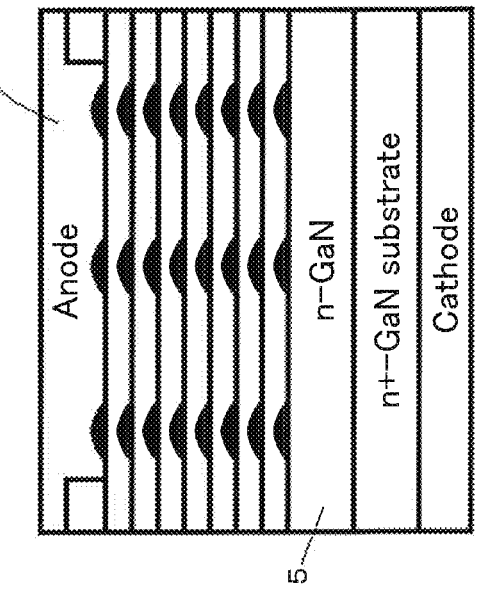

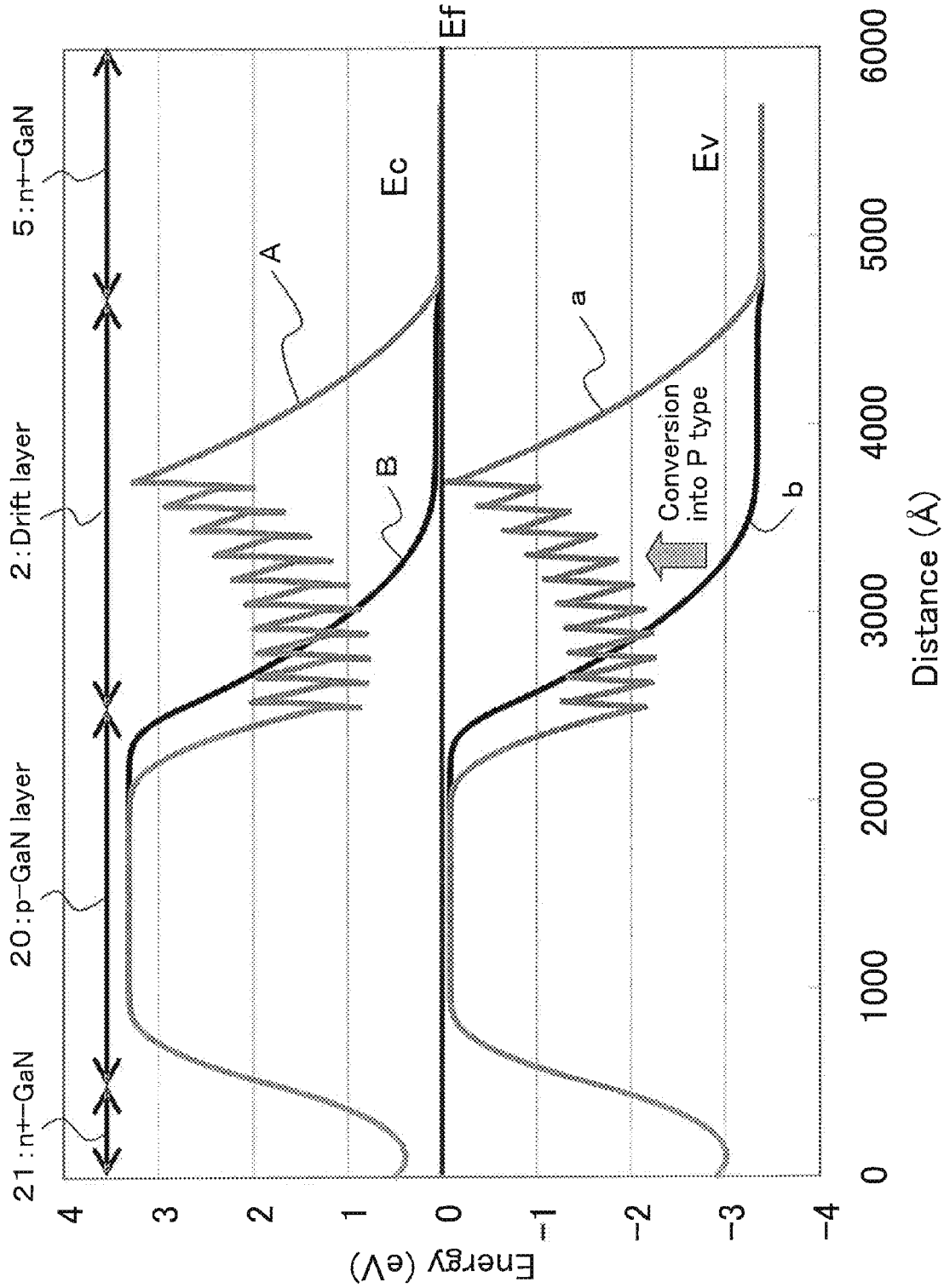

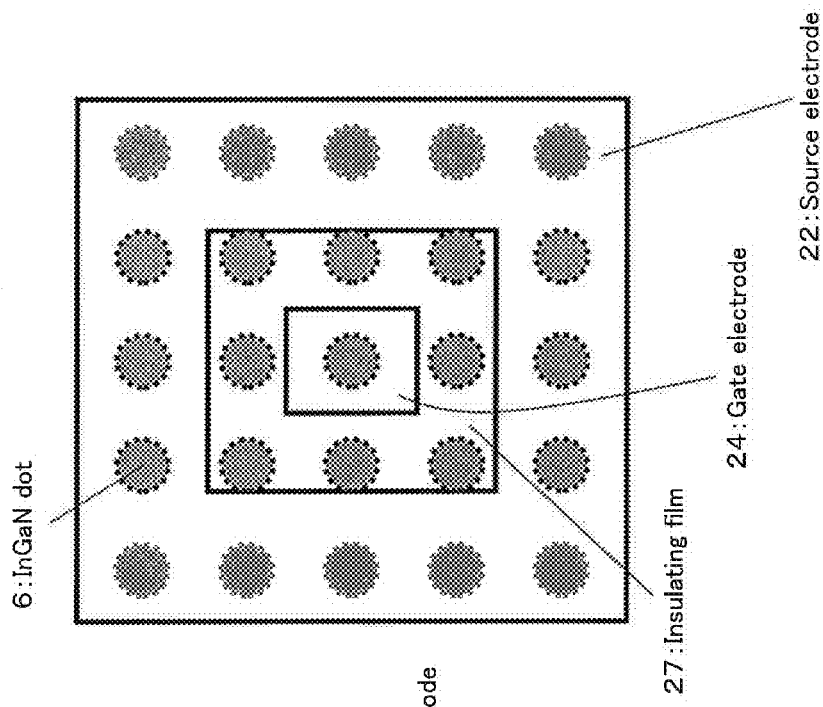
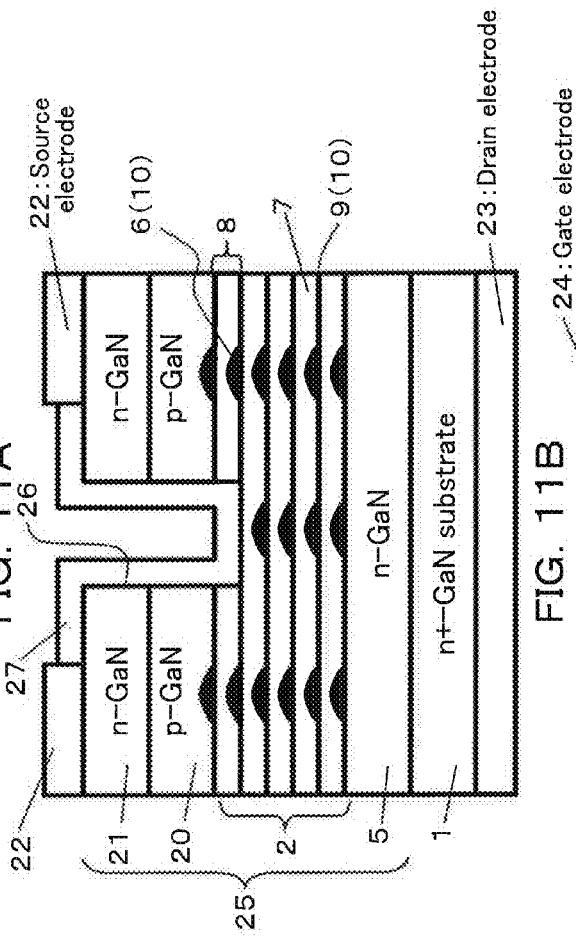
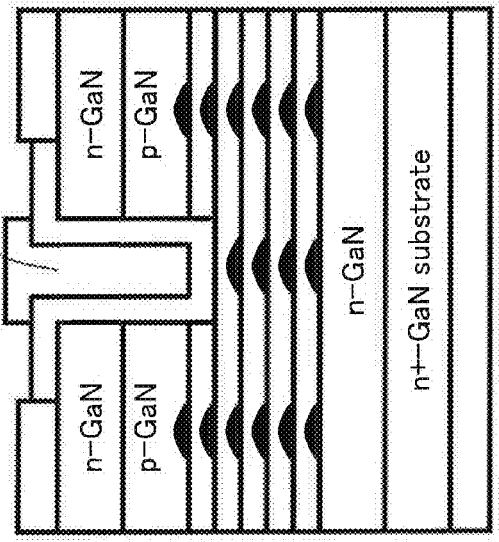
FIG. 11A
FIG. 11B
FIG. 11C

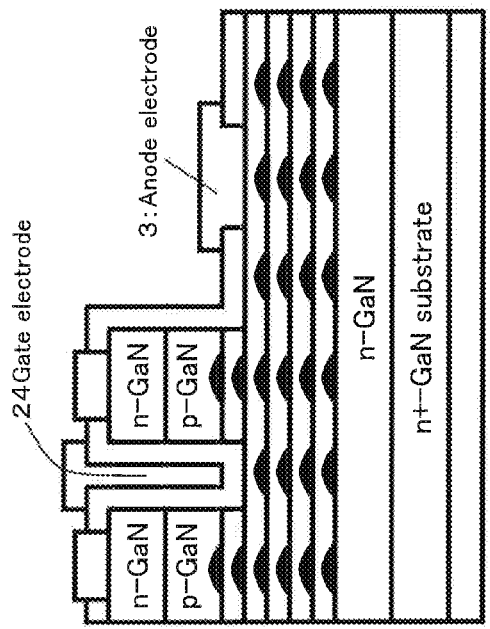
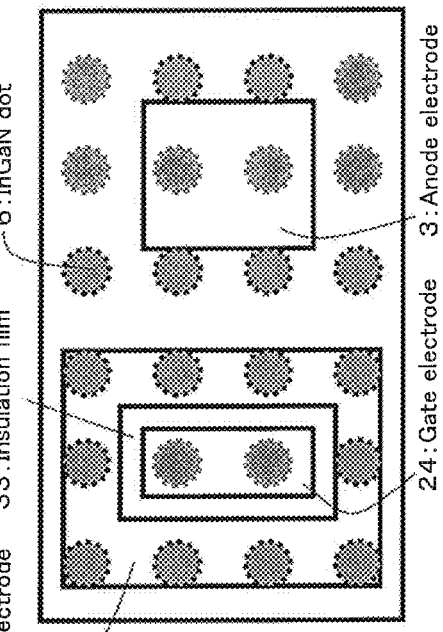
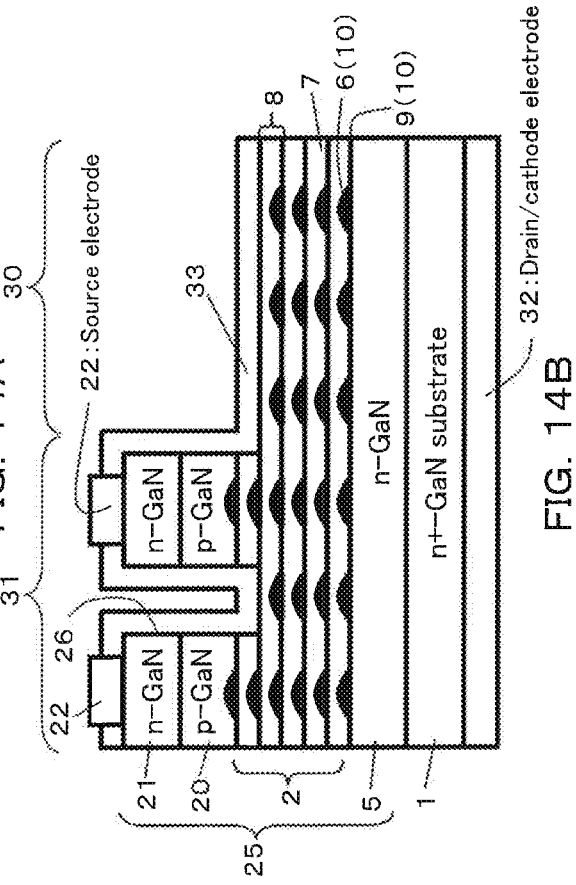
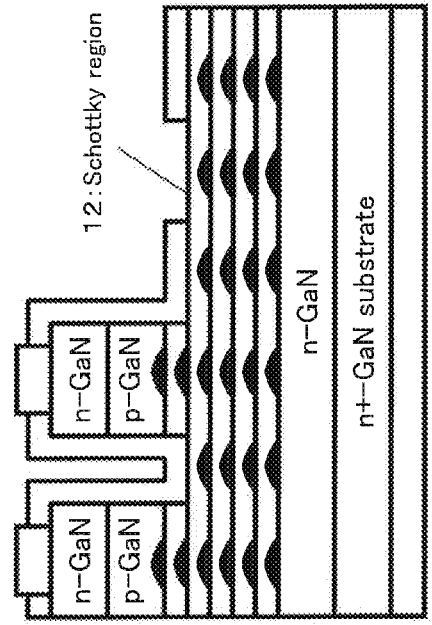

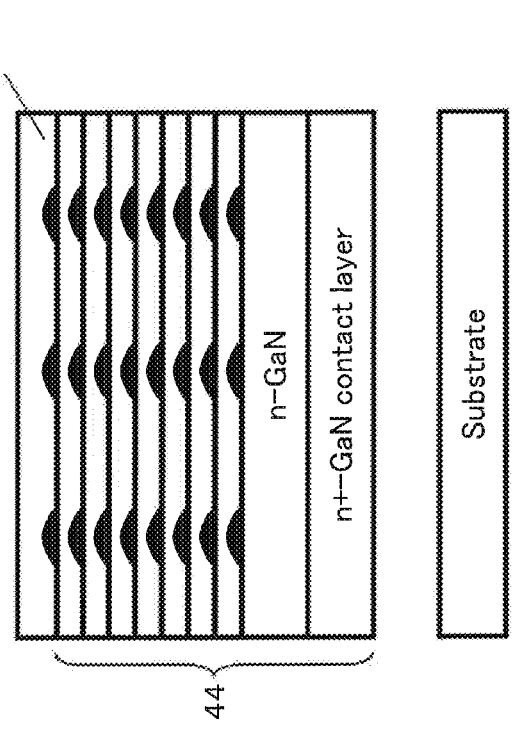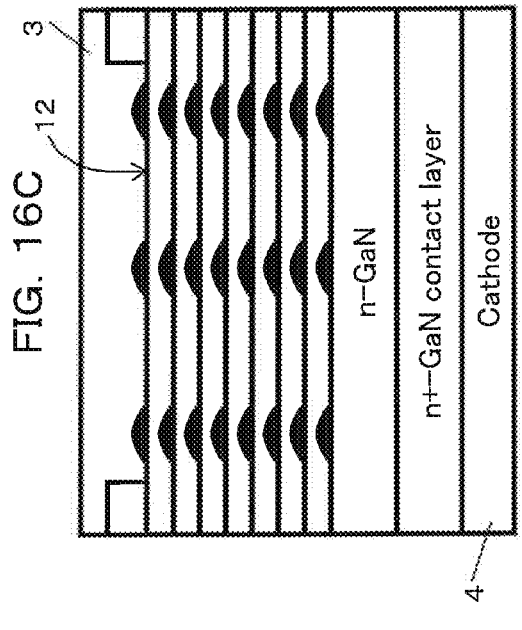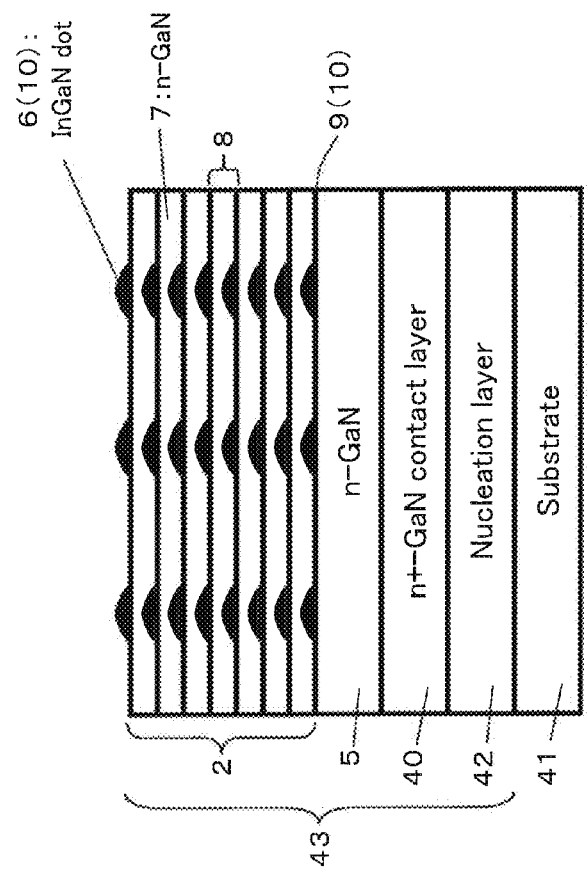

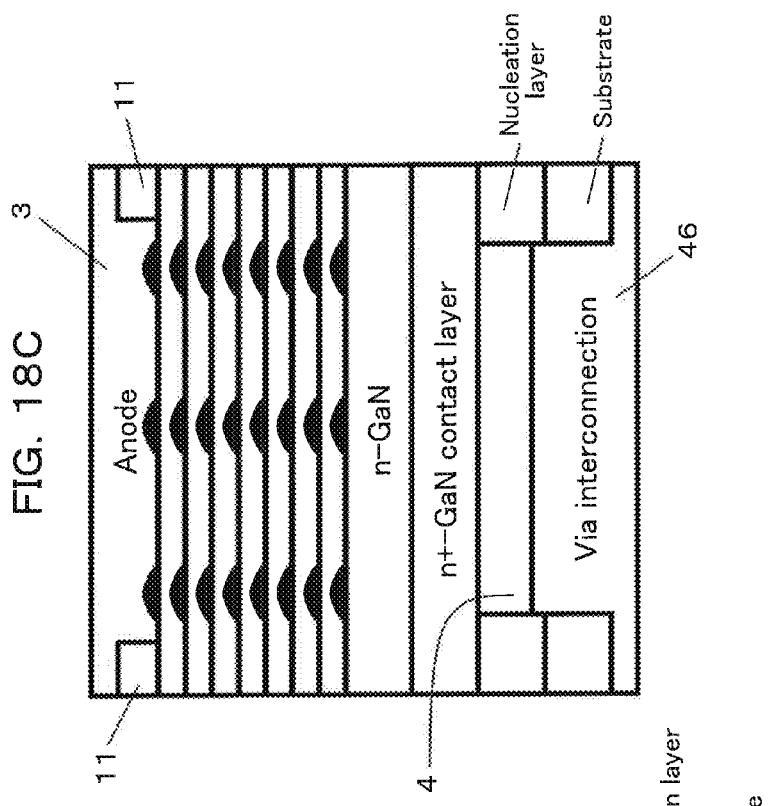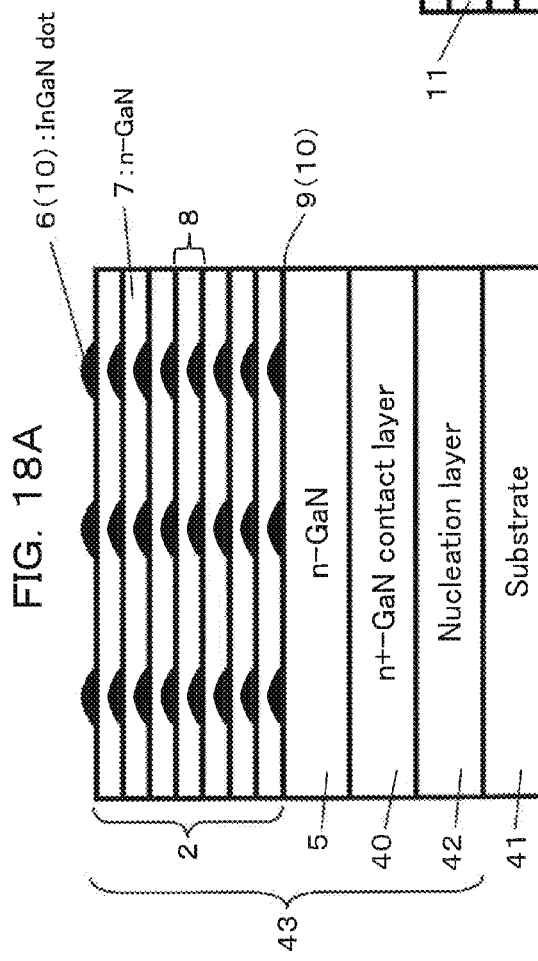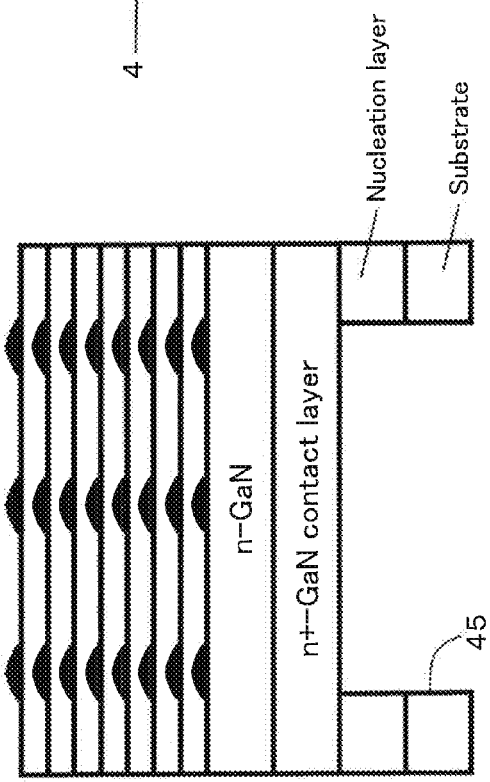

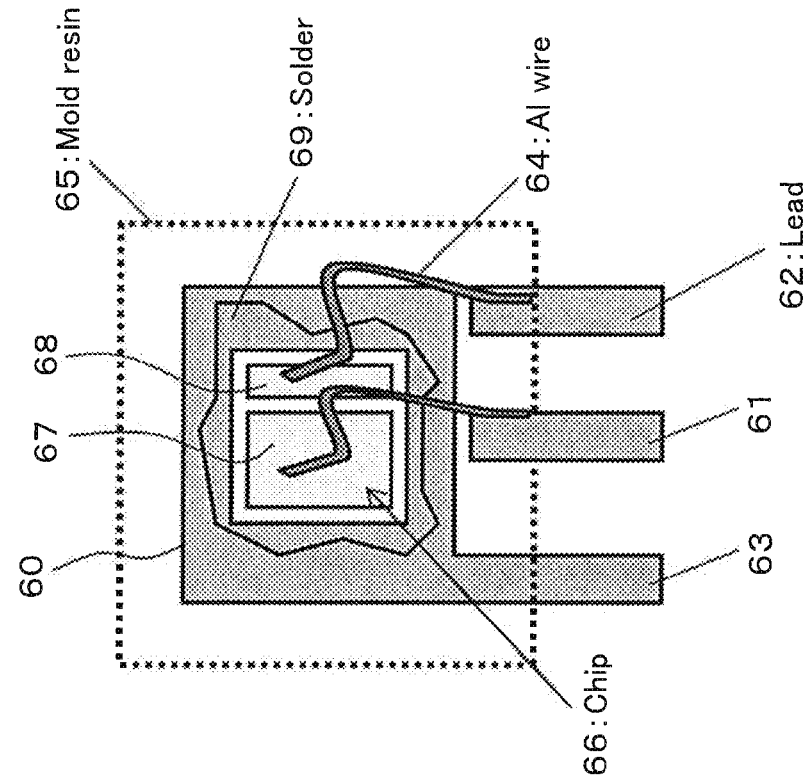
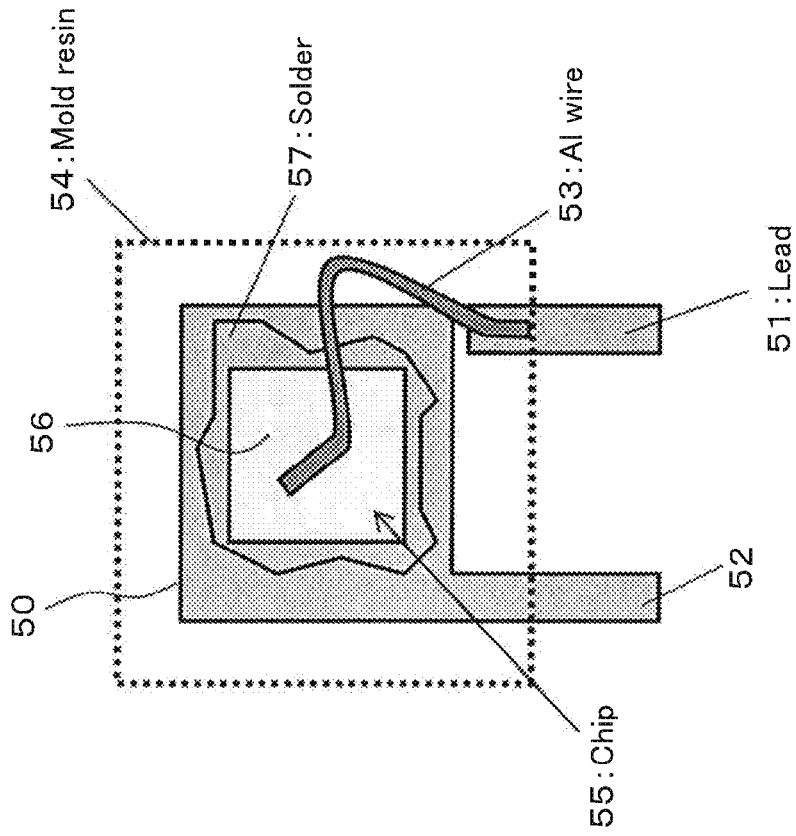

SEMICONDUCTOR DEVICE AND FABRICATION METHOD THEREFOR, AND POWER SUPPLY APPARATUS

CROSS-REFERENCE TO RELATED APPLICATION

This application is a continuation application of International Application PCT/JP2011/073607, filed on Oct. 14, 2011 and designated the U.S., the entire contents of which are incorporated herein by reference.

FIELD

The embodiments discussed herein are related to a semiconductor device and a fabrication method therefor, and a power supply apparatus.

BACKGROUND

A semiconductor device using a gallium nitride (GaN) based semiconductor is expected to be applied, from its physical property characteristics, as a device high in breakdown voltage and operable at a high speed, for example, to a server system and so forth.

Among device characteristics of a GaN based semiconductor device such as, for example, a GaN based Schottky barrier diode or a GaN based vertical transistor, the on-resistance and the breakdown voltage are significant and substantially depend upon a drift layer provided in the GaN based semiconductor device.

Incidentally, since the on-resistance and the breakdown voltage have a tradeoff relationship to each other, if the on-resistance decreases, then the breakdown voltage drops. Therefore, in a conventional semiconductor device that uses Si or SiC, a super-junction structure is adopted for the drift layer as depicted in FIG. 28.

The semiconductor device having such a super-junction type drift structure as just described includes a drift layer having a structure that a p-type semiconductor layer and an n-type semiconductor layer are alternately disposed in a horizontal direction (transverse direction) such that a pn junction interface therebetween extends in a vertical direction (longitudinal direction). The drift layer having such a structure as just described is implemented by repetitions of ion implantation and crystal growth or by trench formation, burying growth and polishing. In the semiconductor device including such a super-junction type drift structure as just described, the on-resistance can be reduced by increasing the donor concentration of the n-type semiconductor layer. However, when the semiconductor device is in an off state, a depletion layer extending along the pn junction interface spreads in a horizontal direction, and therefore, the breakdown voltage can be raised.

SUMMARY

According to an aspect of the embodiment, a semiconductor device and a power supply apparatus include a drift layer including a structure wherein a plurality of quantum dot layers each including a quantum dot containing $In_xGa_{1-x}N$ ($0 \leq x \leq 1$) and a burying layer burying the quantum dot and containing n-type $In_x(Ga_yAl_{1-y})_{1-x}N$ ($0 \leq x \leq 1$, $0 \leq y \leq 1$) are stacked.

According to another aspect of the embodiment, a fabrication method for a semiconductor device includes forming a drift layer by stacking a plurality of quantum dot layers each including a quantum dot containing $In_xGa_{1-x}N$ ($0 \leq x \leq 1$) and a burying layer burying the quantum dot and containing n-type $In_x(Ga_yAl_{1-y})_{1-x}N$ ($0 \leq x \leq 1$, $0 \leq y \leq 1$).

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 6A to 6D are schematic sectional views illustrating a fabrication method for a semiconductor device according to the first embodiment;

FIGS. 7A to 7C are schematic views illustrating the fabrication method for a semiconductor device according to the first embodiment, wherein FIGS. 7A and 7B are sectional views and FIG. 7C is a top plan view;

FIG. 9 is a band diagram illustrating p-type conversion of a region in which quantum dots are provided in the semiconductor device according to the second embodiment;

FIGS. 11A to 11C are schematic views illustrating the fabrication method for a semiconductor device according to the second embodiment, wherein FIGS. 11A and 11B are sectional views and FIG. 11C is a top plan view;

FIGS. 14A to 14D are schematic views illustrating the fabrication method for a semiconductor device according to the third embodiment, wherein FIGS. 14A to 14C are sectional views and FIG. 14D is top plan view;

FIGS. 16A to 16C are schematic sectional views illustrating a fabrication method for a semiconductor device according to the fourth embodiment;

FIGS. 18A to 18C are schematic sectional views illustrating a fabrication method for a semiconductor device according to the fifth embodiment;

FIGS. 19A and 19B are schematic top plan views depicting a configuration of a semiconductor device (semiconductor package) according to a sixth embodiment;

DESCRIPTION OF EMBODIMENTS

When the drift layer of a semiconductor device having the super-junction type drift structure described above is formed by repetitions of ion implantation and crystal growth, processing steps are complicated and much time is required, and besides a high cost is required. Further, when the super-junction type drift structure described above is applied to a GaN based semiconductor device, since a GaN based semiconductor is a material whose p-type conversion by ion implantation is very difficult, it is very difficult to form the drift layer by repetitions of ion implantation and crystal growth.

On the other hand, when the drift layer of the semiconductor device having the super-junction type drift structure described above is formed by trench formation, burying growth and polishing, etching and polishing are used. Therefore, in comparison with an alternative case in which the drift layer is formed by repetitions of ion implantation and crystal growth, processing steps are further complicated and a longer period of time is required, and a higher cost is required. This similarly applies also to a case in which the super-junction type drift structure described above is applied to a GaN based semiconductor device.

In this manner, it is very difficult to implement a super-junction type drift structure in a GaN based semiconductor device described above while the fabrication cost and the number of processing steps are decreased.

Therefore, it is desired to implement a GaN based semiconductor device having performances equivalent to those in the case where the conventional super-junction type drift structure is adopted, namely, having an on-resistance and a breakdown voltage equivalent to those of the case just described, while the fabrication cost and the number of processing steps are decreased.

In the following, a semiconductor device and a fabrication method therefor as well as a power supply apparatus according to several embodiments of the present disclosure are described with reference to the drawings.

[First Embodiment]

First, a semiconductor device and a fabrication method therefor according to a first embodiment are described with reference to FIGS. 1 to 7C.

The semiconductor device according to the present embodiment is a semiconductor device that uses a GaN based semiconductor and that has a high breakdown voltage and can operate at a high speed. The semiconductor device is, for example, a GaN based Schottky barrier diode (GaN based electronic device).

Figure 1:
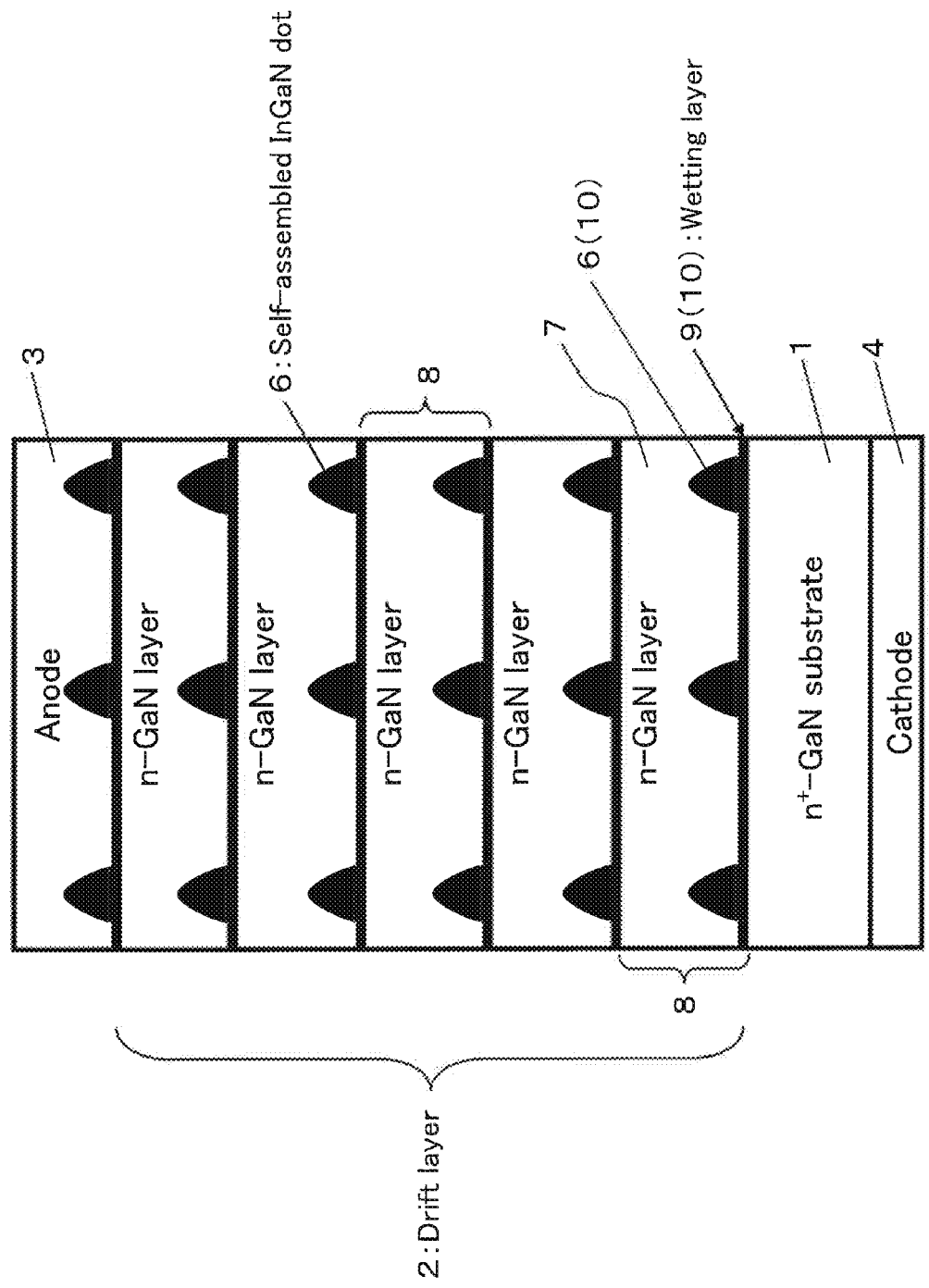
FIG. 1 is a schematic sectional view depicting a configuration of a semiconductor device according to a first embodiment.

As depicted in FIG. 1, the present GaN based Schottky barrier diode includes an n-type GaN substrate 1, a drift layer 2 provided on the n-type GaN substrate 1, an anode electrode 3 joined by Schottky junction to the drift layer 2, and a cathode electrode 4 provided at the back face side (lower surface side) of the n-type GaN substrate 1.

In this case, the n-type GaN substrate 1 is provided at the opposite side to one side of the drift layer 2 on which the anode electrode 3 is provided. Further, the cathode electrode 4 is provided at the opposite side to one side of the n-type GaN substrate 1 at which the drift layer 2 is provided.

It is to be noted that, in the present embodiment, the drift layer 2 is provided on the n-type GaN substrate 1 with an n-type GaN buffer layer 5 interposed therebetween [refer to FIG. 7B]. In other words, the n-type GaN buffer layer 5 is provided between the n-type GaN substrate 1 and the drift layer 2. It is to be noted that the anode electrode 3 is referred to also as Schottky electrode. Further, the cathode electrode 4 is referred to also as ohmic electrode.

In the present embodiment, the drift layer 2 has a structure that a plurality of quantum dot layers 8 each including an InGaN quantum dot 6 and an n-type GaN burying layer 7 burying the InGaN quantum dot 6 are stacked.

The drift layer 2 having such a structure as just described can be formed by repetitively performing steps of growing an InGaN layer 10 on the GaN layers 1, 5 and 7 and burying the InGaN layer 10 with the GaN layer 7. Particularly, if InGaN is grown on GaN, it becomes dotted to form InGaN quantum dots 6. In this case, also an InGaN wetting layer 9 is formed. Therefore, the drift layer 2 includes also the InGaN wetting layers 9. Thereafter, GaN is grown to bury the InGaN quantum dots 6 therein. Then, if InGaN is grown again on the GaN, different InGaN quantum dots 6 are formed just over the buried InGaN quantum dots 6. Therefore, a plurality of InGaN quantum dots 6 are juxtaposed in the vertical direction (longitudinal direction). It is to be noted that, since a plurality of InGaN quantum dots 6 are formed in a horizontal plane, a plurality of InGaN quantum dot groups (columns), in each of which the plurality of InGaN quantum dots 6 juxtaposed in the vertical direction are included, are formed in the horizontal plane. The InGaN quantum dots 6 formed in this manner are referred to as self-assembled InGaN quantum dots. It is to be noted that the InGaN quantum dots 6 are referred to also as InGaN dots or self-assembled quantum dots.

Further, in the present embodiment, the n-type GaN substrate 1 is an $n^+$-GaN (0001) substrate. In this case, the top face (upper surface) of the n-type GaN substrate 1 is a (0001) face, namely, a crystal face having a plane orientation of (0001). In particular, the top face of the n-type GaN substrate 1 is a Ga face, namely, a Ga polar face having the Ga element (chemical element) located on the surface thereof. It is to be noted that the (0001) face or the Ga face is referred to also as (0001) Ga face. In this case, all of the top face (upper surface) of the n-type GaN buffer layer 5 [refer to FIG. 7B] provided on the n-type GaN substrate 1 having the (0001) Ga face on the surface thereof and the top faces (upper surfaces) of the plurality of n-type GaN burying layers 7 provided over the n-type GaN buffer layer 5 are (0001) Ga face. In particular, the top faces of the n-type GaN substrate 1, the n-type GaN buffer layer 5 [refer to FIG. 7B] and the plurality of n-type GaN burying layers 7 all at the anode electrode 3 side are the (0001) Ga face. Therefore, the InGaN quantum dots 6 are provided on the (0001) Ga face of the n-type GaN substrate 1, the n-type GaN buffer layer 5 [refer to FIG. 7B] or the n-type GaN burying layers 7. In other words, the quantum dots 6 are provided on the polar face.

In this manner, if the drift layer 2 is provided on the n-type GaN substrate 1 having the (0001) Ga face on the top face thereof, the InGaN layer 10 including the InGaN quantum dots 6 and the InGaN wetting layer 9 is provided on the (0001) Ga face of the lower side GaN layers 1, 5 and 7. Further, the InGaN layer 10 is buried with the upper side GaN layer 7 having the (0001) Ga face on the top face thereof.

Figure 2:
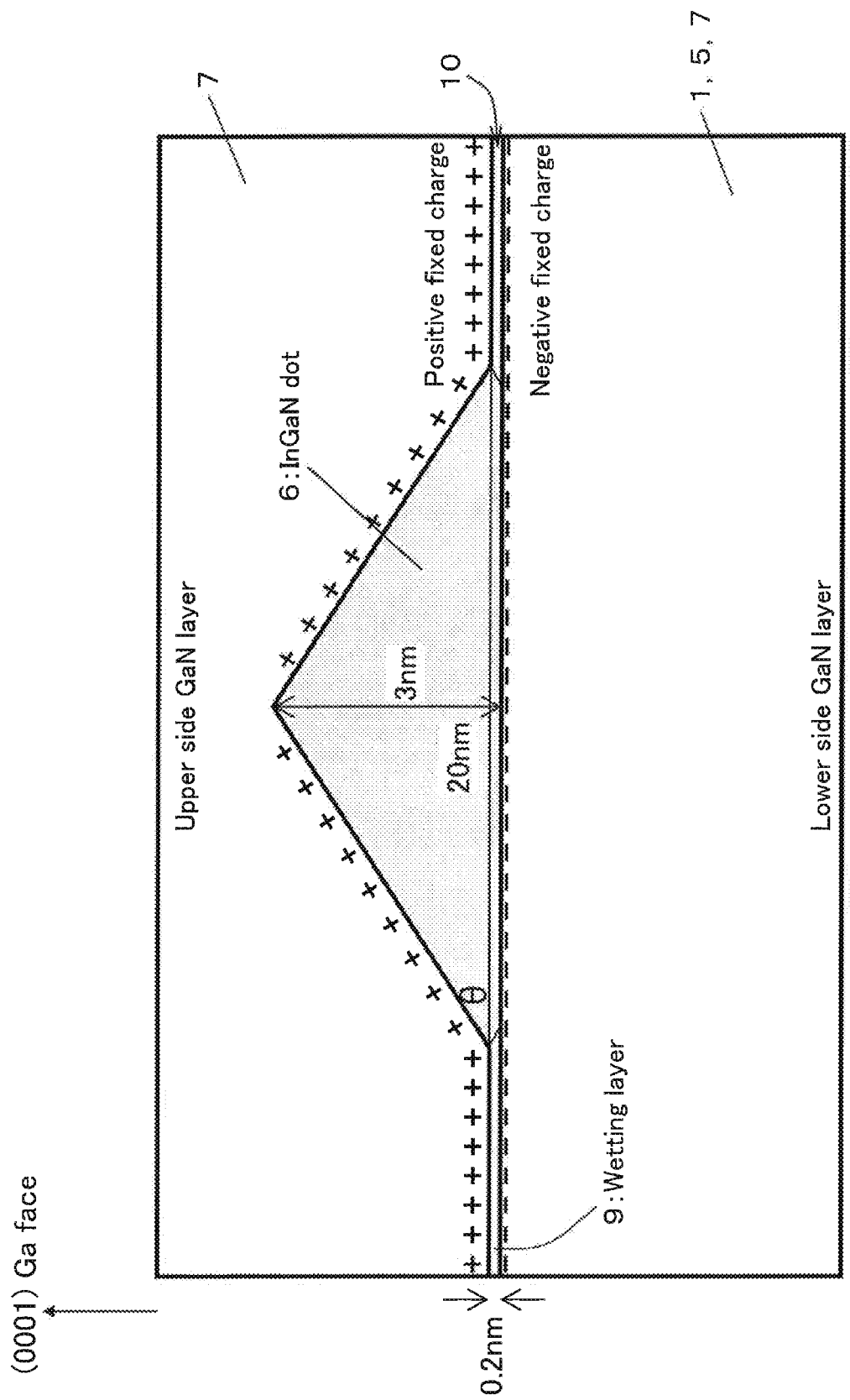
FIG. 2 is a schematic view illustrating p-type conversion of a region in which a quantum dot is provided in the semiconductor device according to the first embodiment.

In this case, as depicted in FIG. 2, negative fixed charge is generated on an interface between the lower side GaN layers 1, 5 and 7 and the InGaN layer 10 while positive fixed charge is generated on an interface between the upper side GaN layer 7 and the InGaN layer 10. Consequently, in accordance with the electroneutrality principle, holes are induced on the interface between the lower side GaN layers 1, 5 and 7 and the InGaN layer 10 while electrons are induced on the interface between the upper side GaN layer 7 and the InGaN layer 10.

Here, the InGaN layer 10 includes the InGaN quantum dots 6 and the InGaN wetting layer 9. Since the wetting layer 9 is very thin, the charge is canceled at the region in which the wetting layer 9 is provided while the charge is not canceled at the region in which the quantum dot 6 is provided. Here, since the shape of the quantum dot 6 is, for example, a triangular shape in cross section, the amount of the positive fixed charge and the amount of the negative fixed charge at the region in which the quantum dot 6 is provided can be represented by the following expression:

Positive fixed charge amount=negative fixed charge amount ×cos θ

Therefore, at the region in which the quantum dot 6 is provided, the negative fixed charge amount is greater than the positive fixed charge amount. Consequently, at the region in which the quantum dot 6 is provided, the amount of holes becomes greater than that of electrons, resulting in occurrence of p-type conversion. In the drift layer 2, the quantum dots 6 are juxtaposed in the vertical direction in the n-type GaN burying layers 7 as described above. Therefore, such a polarization effect as described above can be utilized to convert a region in which the quantum dots 6 are juxtaposed in the vertical direction in the n-type GaN burying layers 7 into p type.

Figure 3:
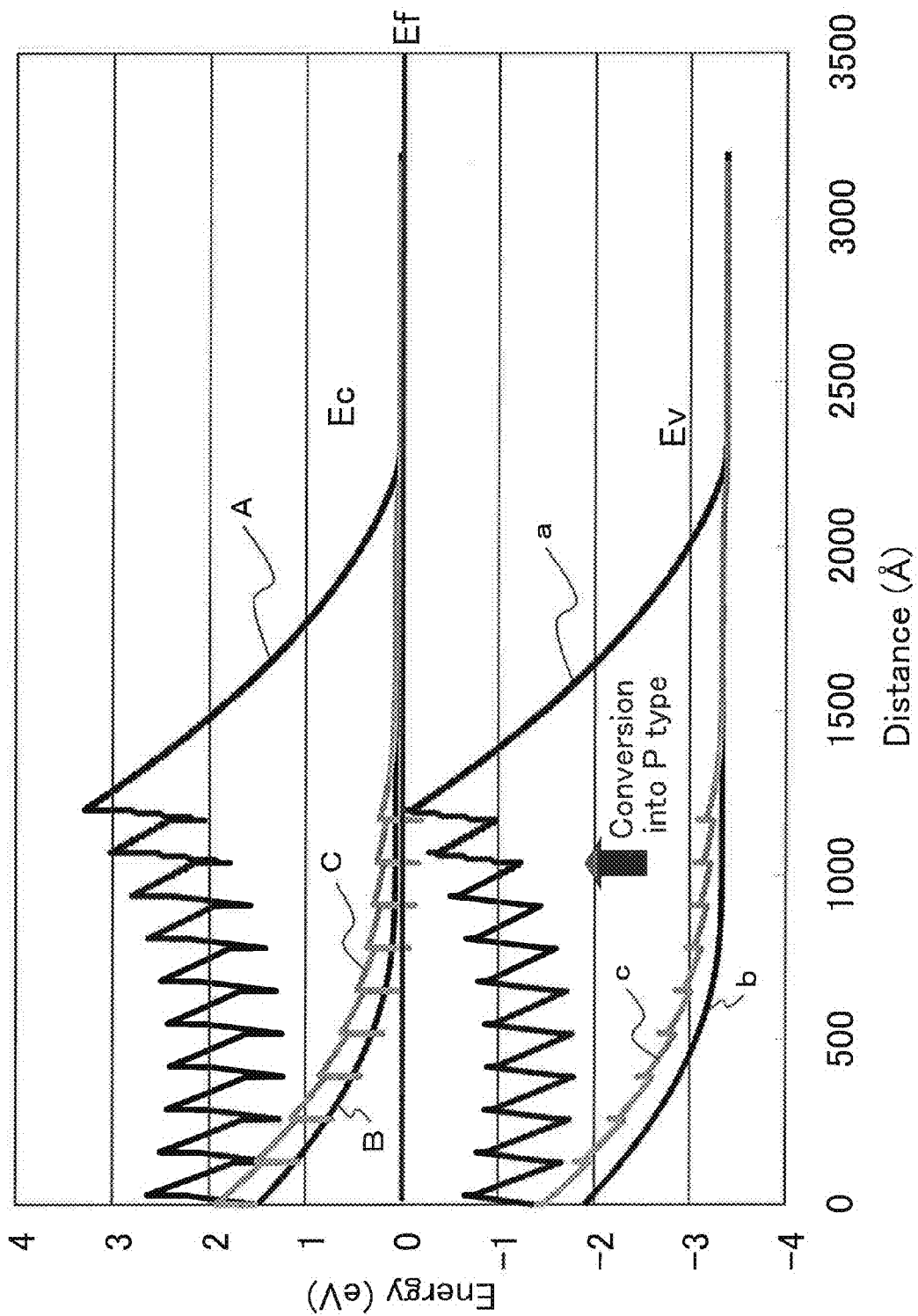
FIG. 3 is a band diagram illustrating p-type conversion of a region in which quantum dots are provided in the semiconductor device according to the first embodiment.

In particular, in the drift layer 2 in the present embodiment having the structure described above, in comparison with a drift layer of a normal structure (n-GaN single drift structure; refer to solid lines B and b in FIG. 3), the region in which the quantum dots 6 are juxtaposed in the vertical direction is converted into p type by a potential lifting effect by the Schottky barrier and the negative fixed charge at the substrate side as indicated by solid lines A and a in FIG. 3. It is to be noted that, since the charge is canceled as described above in the region in which the wetting layer 9 is formed, the potential lifting effect is low as indicated by solid lines C and c in FIG. 3. Further, in FIG. 3, the solid lines A to C indicate lower end energy Ec of the conduction band and the solid lines a to c indicate upper end energy Ev of the valence band. In FIG. 3, the horizontal axis indicates the distance from the interface between the anode electrode and the InGaN quantum dot at the most top face side (the most upper surface side).

Consequently, the drift layer 2 having performances equivalent to those where the conventional super-junction type drift structure is adopted, namely, having an on-resistance and a breakdown voltage (reverse direction breakdown voltage) equivalent to those of the case just described, can be implemented.

Further, the drift layer 2 according to the present embodiment having such a structure as described above does not have a confinement effect like that of a quantum well, and has a thickness of at least approximately 0.1 μm or more and allows traveling only of electrons therein.

It is to be noted that, in an optical device that utilizes an InGaN quantum dot, in order to inject electrons and holes so as to emit light, the InGaN dot is formed in a quantum well (film thickness <0.1 μm) (refer to, for example, Il-Kyu Park et al., "Ultraviolet light-emitting diodes with self-assembled InGaN quantum dots", APPLIED PHYSICS LETTERS, 90, 111116, 2007 or Meng Zhang et al., "A InGaN/GaN quantum dot green (λ=524 nm) laser", APPLIED PHYSICS LETTERS, 98, 221104, 2011). Further, a nitride semiconductor such as GaN generates fixed charge on a hetero interface by spontaneous polarization and piezoelectric polarization depending upon the crystal plane orientation. Therefore, on a crystal plane having a strong polarity, a distance appears between space distributions of the electrons and the holes in the InGaN dot, and this decreases the light emission efficiency. Therefore, in the case of an optical device, a quantum dot is formed on a non-polar face such as the M face or the A face (refer to O. Ambacher et al., "Two-dimensional electron gases induced by spontaneous and piezoelectric polarization charges in N- and Ga-face AlGaN/GaN heterostructures", JOURNAL OF APPLIED PHYSICS, Vol. 85, No. 6, pp. 3222-3233, 1999).

Figure 4A:
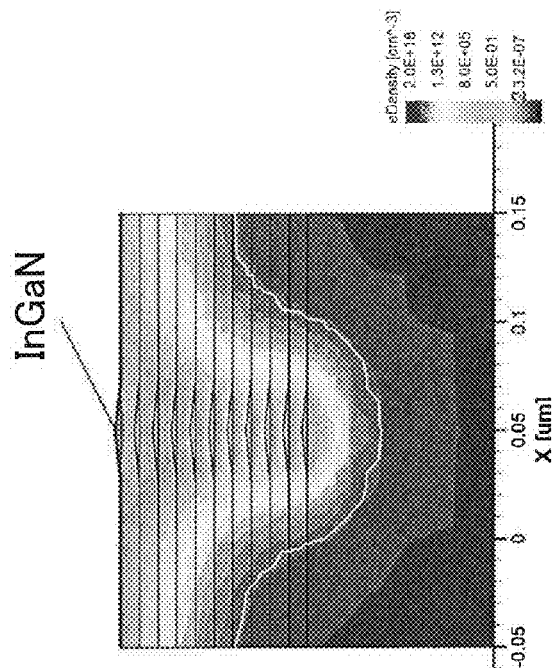
FIG. 4A is a diagram depicting an electron density distribution in a conventional super-junction type drift structure and FIG. 4B is a diagram depicting an electron density distribution in an InGaN dot buried type drift structure according to the first embodiment.
Figure 4B:
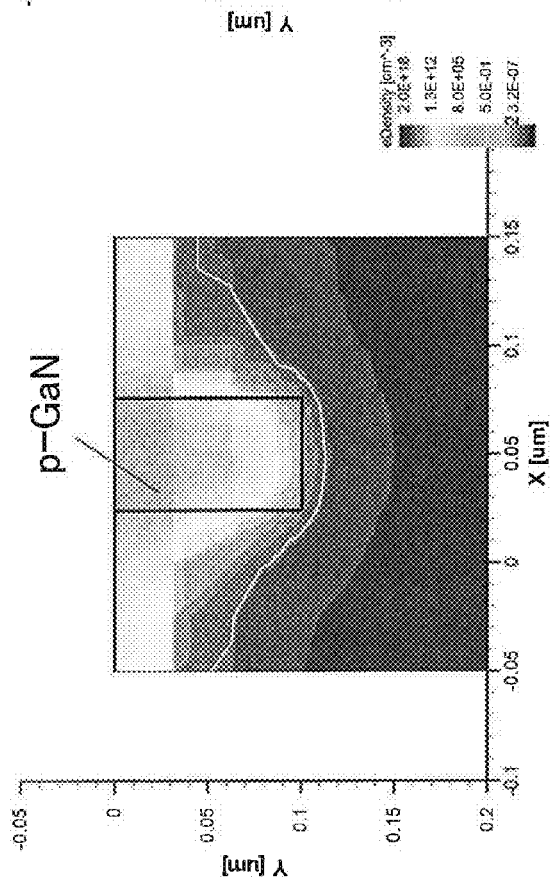

Here, FIG. 4A depicts a result of a simulation of the electron density distribution where the conventional super-junction type drift structure is adopted. FIG. 4B depicts a result of the simulation of the electron density distribution where the InGaN dot buried type drift structure according to the present embodiment is adopted.

In this simulation, the conventional super-junction type drift structure is a structure in which the p-GaN layer is formed at a region of 0.1 μm deep×20 nm wide from the top face side (upper surface side) of the n-GaN layer, for example, by trench formation, burying growth and polishing. Here, the impurity concentration of the n-GaN layer is approximately $2 \times 10^{17}$ cm$^{-3}$ and the thickness is approximately 0.5 μm. Further, the impurity concentration of the p-GaN layer is approximately $3.3 \times 10^{17}$ cm$^{-3}$.

On the other hand, the InGaN dot buried type drift structure is a structure in which ten layers individually configured by burying an InGaN quantum dot with an n-GaN burying layer are stacked on the n-GaN buffer layer. Here, the impurity concentration of the n-GaN buffer layer is approximately $2 \times 10^{17}$ cm$^{-3}$ and the thickness of the n-GaN buffer layer is approximately 0.4 μm. Meanwhile, the InGaN quantum dot has a triangular shape in cross section of the bottom of approximately 20 nm×height of approximately 3 nm (refer to FIG. 2), and an In composition is approximately 0.2. Further, the dot density is approximately $1\times10^{10}$ cm$^{-2}$. Further, the thickness of the wetting layer is approximately 0.2 nm. Further, the impurity concentration of the n-GaN burying layer is approximately $2\times10^{17}$ cm$^{-3}$ and the thickness of the n-GaN burying layer is approximately 10 nm. In this case, the negative fixed charge of the lower side GaN/InGaN interface is approximately $1.9\times10^{13}$ cm$^{-2}$ and the positive fixed charge of the upper side GaN/InGaN interface is approximately $1.85\times10^{13}$ cm$^{-2}$. Here, the positive fixed charge at the region in which the InGaN quantum dot is provided is calculated as cos θ times the negative fixed charge taking the dot shape of the triangular shape in cross section into consideration (refer to FIG. 2).

As depicted in FIGS. 4A and 4B, a substantially similar electron density distribution is indicated in both of the case in which the conventional super-junction type drift structure is adopted and the case in which the InGaN dot buried type drift structure is adopted. This indicates a rise of the potential (conduction band potential) in a region in which the InGaN quantum dots are juxtaposed in the vertical direction in the n-GaN layer, namely, indicates p-type conversion of the region and further indicates that electrons flow in a region other than the region in which the InGaN quantum dots are juxtaposed in the vertical direction.

Figure 5:
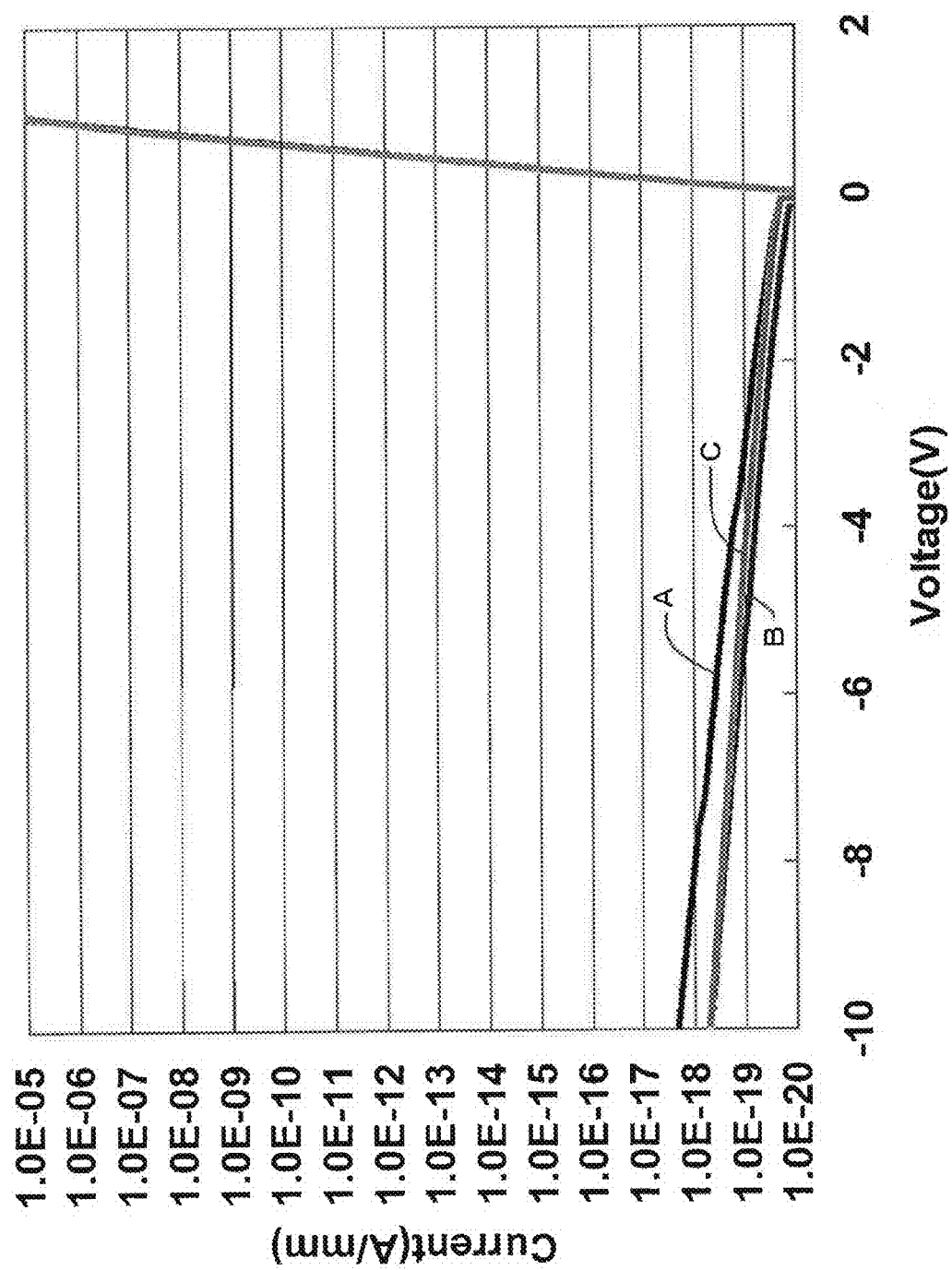
FIG. 5 is a view depicting a current-voltage characteristic (I-V characteristic) of an n-GaN single drift structure, a conventional super-junction type drift structure and the InGaN dot buried type drift structure of the first embodiment.

FIG. 5 depicts a result of a simulation of the current-voltage characteristic where each of the n-GaN single drift structure, conventional super-junction type drift structure and InGaN dot buried type drift structure is adopted. It is to be noted that, in FIG. 5, a solid line A indicates a result of the simulation of the current-voltage characteristic of the n-GaN single drift structure; a solid line B indicates a result of the simulation of the current-voltage characteristic of the conventional super-junction type drift structure; and a solid line C indicates a result of the simulation of the current-voltage characteristic of the InGaN dot buried type drift structure.

Here, the n-GaN single drift structure is configured from a single n-GaN layer, and the impurity concentration of the n-GaN layer is approximately $2\times10^{17}$ cm$^{-3}$ and the thickness of the n-GaN layer is approximately 0.5 μm. It is to be noted that the results of the simulation of the conventional super-junction type drift structure and the InGaN dot buried type drift structure are similar to those of the simulation of FIGS. 4A and 4B described hereinabove.

As depicted in FIG. 5, although a forward characteristic does not differ irrespective of whichever one of the drift structures is adopted, reverse-directional leak current where the InGaN dot buried type drift structure is adopted is lower than that where the n-GaN single drift structure is adopted and is substantially equal to that where the conventional super-junction type drift structure is adopted. This indicates that, where the InGaN dot buried type drift structure is adopted, an effect similar to that where the conventional super-junction type drift structure is adopted is achieved.

Now, a fabrication method for a semiconductor device (GaN base Schottky barrier diode) according to the present embodiment is described with reference to FIGS. 6A to 6D and FIGS. 7A to 7C.

The present fabrication method for a semiconductor device includes a step of stacking a plurality of quantum dot layers 8 each including an InGaN quantum dot 6 and a GaN burying layer 7 burying the InGaN quantum dot 6 thereinto form a drift layer 2. In the present embodiment, the step of forming the drift layer 2 includes a step of forming an InGaN quantum dot 6 on a polar face (here, a Ga polar face) of the n-type GaN layers (first semiconductor layers) 1, 5 and 7 and another step of burying the InGaN quantum dot 6 with the n-type GaN layer 7 (second semiconductor layer). Further, the fabrication method includes a step of forming an anode electrode 3 joined by Schottky junction to the drift layer 2 after the step of forming the drift layer 2.

The fabrication method is described below more particularly.

First, the n-GaN buffer layer 5 is grown on the n$^+$-GaN (0001) substrate 1 as depicted in FIG. 6A, for example, by a plasma-assisted molecular beam epitaxy (PAMBE) method. Here, the growth temperature is approximately 750° C. Further, the n-GaN buffer layer 5 has a thickness of approximately 0.2 μm and an impurity concentration of approximately $2\times10^{17}$ cm$^{-3}$.

Then, the InGaN dot buried drift layer 2 is formed as depicted in FIG. 6B. In particular, the growth temperature is lowered to approximately 520° C. and then an InGaN layer 10 is grown. Consequently, InGaN dots 6 are formed in a self-assembled manner. In this case, also an InGaN wetting layer 9 is formed. Thereafter, an n-GaN burying layer 7 is grown. The steps just described are repetitively performed to form the InGaN dot buried drift layer 2 with a desired thickness. In this manner, the InGaN dot buried drift layer 2 can be grown consistently. Here, the n-GaN layer 7 has a thickness of approximately 10 nm and an impurity concentration of approximately $2\times10^{17}$ cm$^{-3}$. Further, the thickness of the drift layer 2 is, for example, approximately 1 μm.

Then, passivation of the surface is performed with a SiN film (insulating film) 11 formed, for example, by a plasma CVD (Chemical Vapor Deposition) method as depicted in FIG. 6C. In particular, the SiN passivation film 11 is formed on the top face (upper surface) of the drift layer 2 formed in such a manner as described above. Here, the thickness of the SiN film 11 is, for example, approximately 400 nm.

Then, the cathode electrode 4 is formed at the back face side of the substrate 1 as depicted in FIG. 6D. In particular, the cathode electrode 4, for example, of Ti/Al is formed on the overall back face of the substrate, for example, by a vapor deposition method. Here, the thickness of the Ti/Al is approximately 30 nm/approximately 300 nm. Thereafter, rapid thermal annealing (RTA) is performed at approximately 600° C.

Then, as depicted in FIG. 7A, patterning of resist (not depicted) is performed, for example, by photolithography in order to expose the top face of the drift layer 2, namely, a Schottky region 12 to which the anode electrode 3 is to be joined by Schottky junction. Then, the SiN passivation film 11 is subjected to dry etching to form an opening on the SiN passivation film 11 so as to expose the Schottky region 12 through the opening. Here, for example, SF$_6$/CHF$_3$ gas is used, and the upper electrode power is approximately 500 W while the lower electrode power is approximately 50 W and the SiN etching rate is approximately 0.24 μm/min.

Then, the resist is removed and then the anode electrode 3, for example, of TaN/Cu is formed, for example, by a sputtering method in the Schottky region 12 at the top face side (upper surface side) of the drift layer 2 as depicted in FIGS. 7B and 7C.

The semiconductor device (GaN based Schottky barrier diode) according to the present embodiment can be fabricated in this manner. In particular, the Schottky barrier diode having the InGaN dot buried type drift structure having performances equivalent to those of the Schottky barrier diode having the conventional super-junction type drift structure can be fabricated. Since, in the Schottky barrier diode having such an InGaN dot buried type drift structure as described above, the drift layer 2 can be grown consistently as described above, the Schottky barrier diode of the present embodiment can be fabricated more readily than the Schottky barrier diode having the conventional super-junction type drift structure. Also the number of processing steps can be decreased and reduction of the cost can be implemented.

Accordingly, the semiconductor device and the fabrication method therefor according to the present embodiment are advantageous in that a semiconductor device having performances equivalent to those where the conventional super-junction type drift structure is adopted, namely, having an on-resistance and a breakdown voltage (reverse direction breakdown voltage) equivalent to those where the conventional super-junction type drift structure is adopted, can be implemented while the fabrication cost and the number of processing steps are decreased.

[Second Embodiment]

Now, a semiconductor device and a fabrication method therefor according to a second embodiment are described with reference to FIGS. 8 to 11C.

The semiconductor device according to the present embodiment is a semiconductor device that uses a GaN based semiconductor and that has a high breakdown voltage and can operate at a high speed. The semiconductor device is, for example, a GaN based vertical transistor (GaN based electronic device; for example, UMOSFET: U-shaped trench metal oxide semiconductor field effect transistor).

Figure 8:
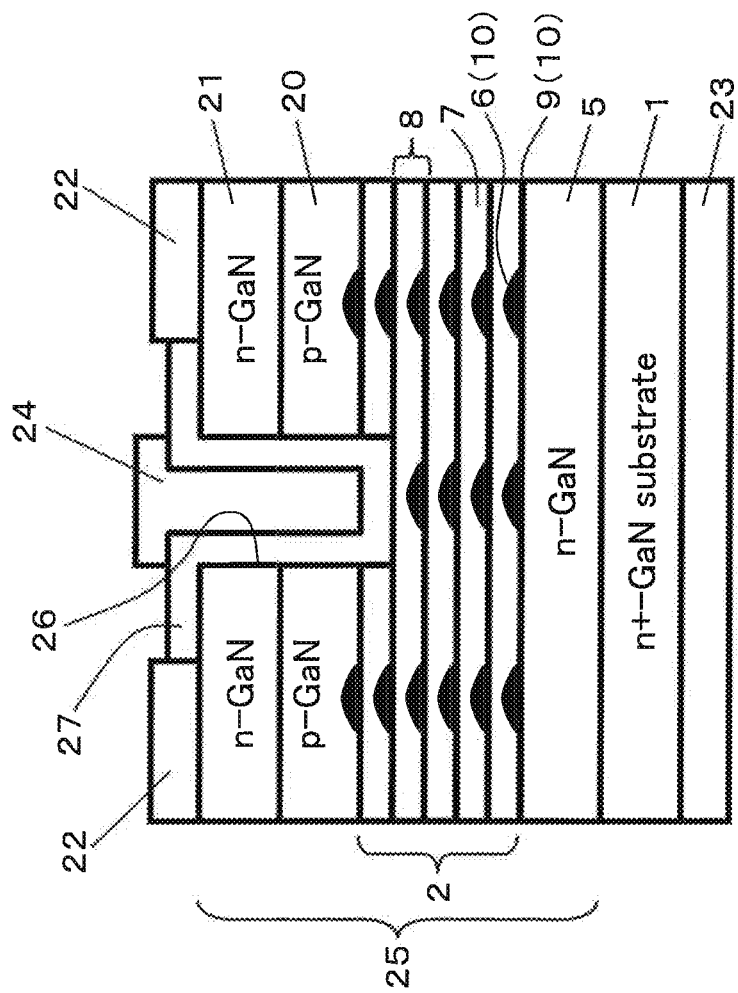
FIG. 8 is a schematic sectional view depicting a configuration of a semiconductor device according to a second embodiment.

As depicted in FIG. 8, the present GaN based vertical transistor includes an n-type GaN substrate 1, an n-type GaN buffer layer 5, an InGaN dot buried drift layer 2, a p-type GaN body layer 20 (p-type semiconductor layer), an n-type GaN contact layer 21, a source electrode 22, a drain electrode 23 and a gate electrode 24. It is to be noted that a structure wherein the n-type GaN buffer layer 5, InGaN dot buried drift layer 2, p-type GaN body layer 20 and n-type GaN contact layer 21 are stacked is referred to as semiconductor stacked structure 25. Further, each of the drain electrode 23 and the source electrode 22 is referred to also as ohmic electrode.

Here, the source electrode 22 is provided at the top face side (upper surface side) of the semiconductor stacked structure 25. In particular, the source electrode 22 is provided at the opposite side to one side of the p-type GaN body layer 20 at which the InGaN dot buried drift layer 2 is provided. Further, the drain electrode 23 is provided at the back face side of the n-type GaN substrate 1. In particular, the drain electrode 23 is provided at the opposite side to one side of the n-type GaN substrate 1 at which the InGaN dot buried drift layer 2 is provided. Further, the gate electrode 24 is provided at the top face side of the semiconductor stacked structure 25, namely, at the side on which the source electrode 22 is provided. In particular, the gate electrode 24 is provided in a gate trench 26, which extends from the contact layer 21 configuring the top face of the semiconductor stacked structure 25 to the InGaN dot buried drift layer 2, with an insulating film 27 interposed therebetween. Further, the n-type GaN substrate 1 is provided at the opposite side to one side of the InGaN dot buried drift layer 2 at which the p-type GaN body layer 20 is provided. It is to be noted that the n-type GaN buffer layer 5 may be provided as occasion demands.

In the present embodiment, the InGaN dot buried drift layer 2 is configured similarly to that of the first embodiment described hereinabove. Further, while the anode electrode 3 in the first embodiment described hereinabove is joined by Schottky junction to the InGaN dot buried drift layer 2, in the present embodiment, the p-type GaN body layer 20 contacts with the InGaN dot buried drift layer 2. Therefore, in the structure including the InGaN dot buried drift layer 2 in the present embodiment, in comparison with the structure including a drift layer (n-GaN single drift structure; indicated by solid lines B and b in FIG. 9) of the normal structure, a region in which the quantum dots 6 are juxtaposed in the vertical direction is converted into P type by a potential lifting effect by the p-type GaN body layer 20 and the negative fixed charge at the substrate side as indicated by solid lines A and a in FIG. 9. It is to be noted that, in FIG. 9, the solid lines A and B indicate energy Ec at the lower end of the conduction band and the solid lines a and b indicate energy Ev at the upper end of the valence band. Further, in FIG. 9, the horizontal axis indicates the distance from the interface between the source electrode and the n-GaN layer.

It is to be noted that details of the configuration of the other part are similar to those of the first embodiment described above, and therefore, description of them is omitted here.

Now, a fabrication method for a semiconductor device (GaN based Schottky barrier diode) according to the present embodiment is described with reference to FIGS. 10A to 10D and 11A to 11C.

The fabrication method according to the present embodiment includes a step of stacking a plurality of quantum dot layers 8 each including an InGaN quantum dot 6 and a GaN burying layer 7 burying the InGaN quantum dot 6 thereby to form the drift layer 2. In the present embodiment, the step of forming the drift layer 2 includes a step of forming the InGaN quantum dot 6 on a polar face (here, a Ga polar face) of n-type GaN layers 1, 5 and 7 (first semiconductor layers) and another step of burying the InGaN quantum dot 6 with the n-type GaN layer 7 (second semiconductor layer). The fabrication method further includes a step of forming a p-type GaN body layer 20 (p-type semiconductor layer) contacting with the drift layer 2 after the step of forming the drift layer 2.

The fabrication method is described below particularly.

Figure 10A:
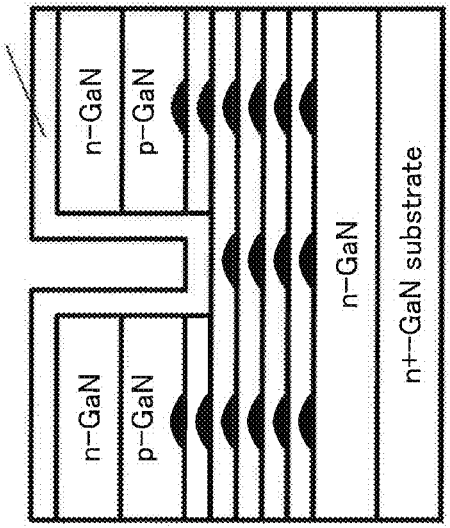
FIGS. 10A to 10D are schematic sectional views illustrating a fabrication method for a semiconductor device according to the second embodiment.

First, the n-GaN buffer layer 5, InGaN dot buried drift layer 2, p-GaN body layer 20 and n-GaN contact layer 21 are grown by crystal growth on the n-GaN (0001) substrate 1 as depicted in FIG. 10A, for example, by a PAMBE method to form the semiconductor stacked structure 25.

Here, the growth temperature of the drift layer 2 is approximately 520° C. and the growth temperature of the other layers is approximately 750° C. Further, the thickness of the n-GaN buffer layer 5 is approximately 0.2 µm and the impurity concentration is approximately $2\times10^{17}$ cm$^{-3}$. Further, the InGaN dot buried drift layer 2 is formed by a process similar to that in the first embodiment described above, and the thickness of the InGaN dot buried drift layer 2 is, for example, approximately 1 µm. Further, the p-GaN body layer 20 has a thickness of approximately 1 µm and an impurity concentration of approximately $1\times10^{17}$ cm$^{-3}$. Further, the n-GaN contact layer 21 has a thickness of approximately 0.2 µm and an impurity concentration of approximately $2\times10^{18}$ cm$^{-3}$.

Figure 10B:
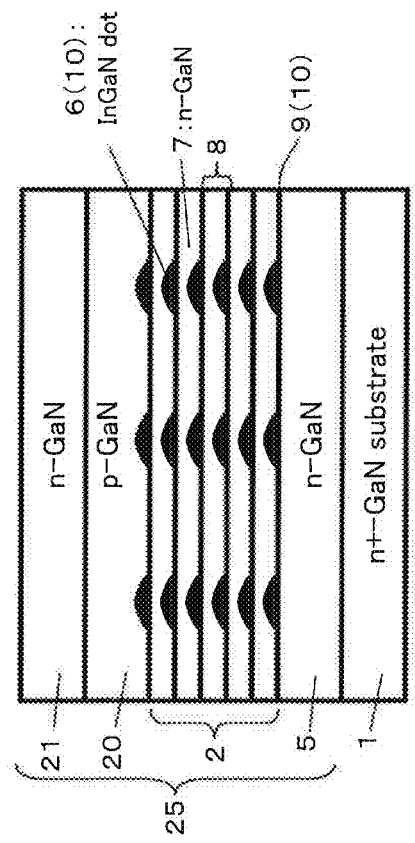

Then, the gate trench 26 is formed as depicted in FIG. 10B. In particular, patterning is performed so that the resist 28 may remain in a region other than a region in which the gate trench 26 is to be formed. Then, the n-GaN contact layer 21, the p-GaN body layer 20 and part of the InGaN dot buried drift layer 2 is removed, for example, by chlorine based dry etching to form the gate trench 26. Thereafter, the resist 28 is removed.

Figure 10C:
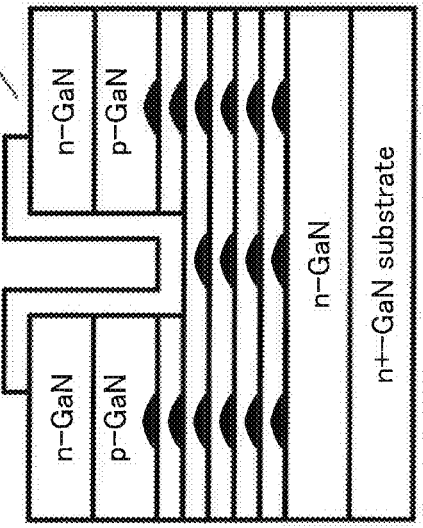

Then, the insulating film 27 that covers the top face of the semiconductor stacked structure 25 and functions as a gate insulating film is formed as depicted in FIG. 10C. In particular, the insulating film 27, for example, of SiO$_2$, SiN or AlO is deposited on the overall wafer face, for example, by a plasma CVD method or an ALD (Atomic Layer Deposition) method. Here, the thickness of the insulating film 27 is approximately 50 nm.

Figure 10D:
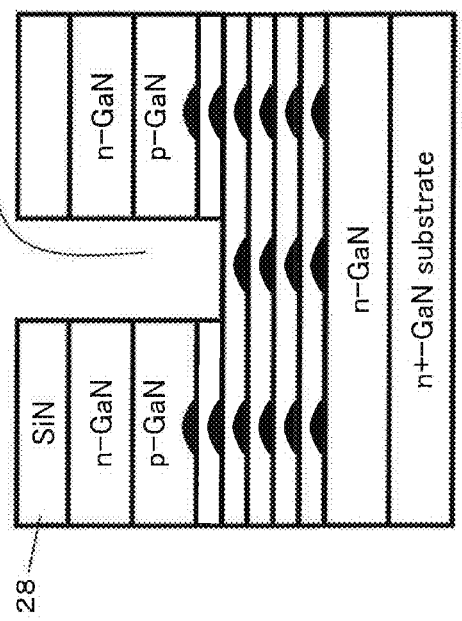

Then, the source electrode 22 is formed at the top face side of the semiconductor stacked structure 25 and the drain electrode 23 is formed at the back face side of the substrate 1 as depicted in FIGS. 10D and 11A.

In particular, patterning is performed first so that the resist (not depicted) may remain in a region other than a region 22X in which the source electrode 22 is to be formed and then the insulating film 27 is removed by dry etching using desired gas as depicted in FIG. 10D. Then, the resist is removed, and then the source electrode 22, for example, of Ti/Al is formed at the top face side of the semiconductor stacked structure 25, for example, by a vapor deposition and lift-off method as depicted in FIG. 11A. Then, the drain electrode 23, for example, of Ti/Al is formed on the overall back face of the substrate, for example, by a vapor deposition method. Here, the thickness of the Ti/Al is approximately 30 nm/approximately 300 nm. Thereafter, rapid thermal annealing (RTA) is performed at approximately 600° C.

Then, the gate electrode 24 is formed on the insulating film 27 formed on the gate trench 26 as depicted in FIG. 11B. In particular, the gate electrode 24, for example, of TaN/Cu is formed, for example, by a sputtering method.

The semiconductor device (GaN based vertical transistor) according to the present embodiment can be fabricated in this manner. In other words, a vertical transistor that has the InGaN dot buried type drift structure having performances equivalent to those of the vertical transistor having the conventional super-junction type drift structure can be fabricated. In the vertical transistor having such an InGaN dot buried type drift structure as described above, the drift layer can be grown consistently as described above. Therefore, the vertical transistor according to the present embodiment can be fabricated more readily than the vertical transistor having the conventional super-junction type drift structure, and the number of processing steps can be decreased and the cost can be reduced.

Accordingly, the semiconductor device and the fabrication method therefor according to the present embodiment are advantageous in that a semiconductor device having performances equivalent to those where the conventional super-junction type drift structure is adopted, namely, having an on-resistance and a breakdown voltage (reverse direction breakdown voltage) equivalent to those where the conventional super-junction type drift structure is adopted, can be implemented while the fabrication cost and the number of processing steps are decreased.

[Third Embodiment]

Now, a semiconductor device and a fabrication method therefor according to a third embodiment are described with reference to FIGS. 12 to 14D.

In the semiconductor device according to the present embodiment, the GaN based Schottky barrier diode (GaN based electronic device) of the first embodiment described above and the GaN based vertical transistor (GaN based electronic device; for example, a UMOSFET) of the second embodiment described above are provided on the same substrate.

Figure 12:
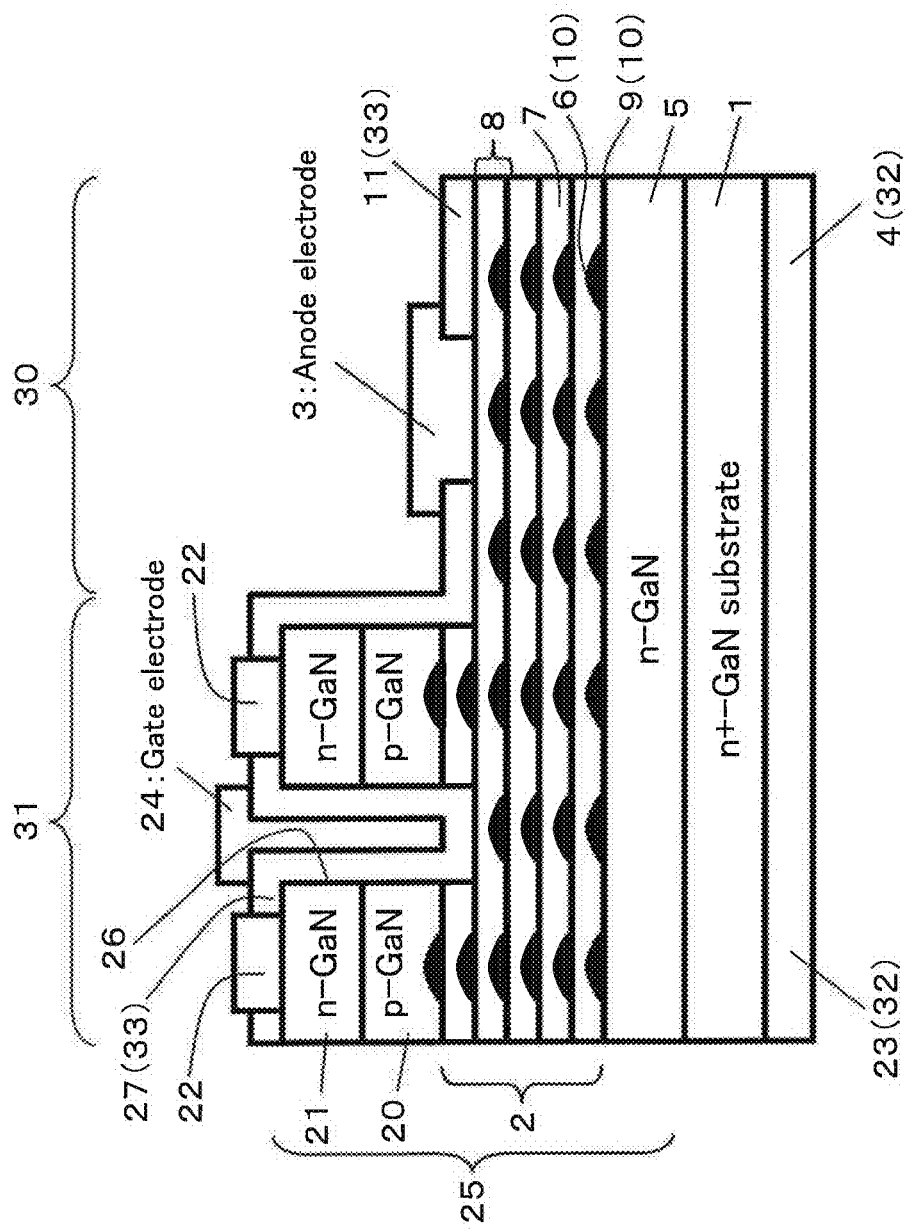
FIG. 12 is a schematic sectional view depicting a configuration of a semiconductor device according to a third embodiment.

In particular, as depicted in FIG. 12, the present semiconductor device includes a GaN based Schottky barrier diode region 30 and a GaN based vertical transistor region 31.

Here, the GaN based Schottky barrier diode region 30 includes an n-type GaN substrate 1, an n-type GaN buffer layer 5, an InGaN dot buried drift layer 2, an anode electrode 3 joined by Schottky junction to the drift layer 2 and a cathode electrode 4 provided at the back face side of the n-type GaN substrate 1. The n-type GaN substrate 1 is provided at the opposite side to one side of the in GaN dot buried drift layer 2 at which the anode electrode 3 is provided. Meanwhile, the cathode electrode 4 is provided at the opposite side to one side of the n-type GaN substrate 1 at which the InGaN dot buried drift layer 2 is provided. It is to be noted that the n-type GaN buffer layer 5 may be provided as occasion demands.

Meanwhile, the GaN based vertical transistor region 31 includes the n-type GaN substrate 1, the n-type GaN buffer layer 5, the InGaN dot buried drift layer 2, a p-type GaN body layer 20 (p-type semiconductor layer), an n-type GaN contact layer 21, a source electrode 22, a drain electrode 23 and a gate electrode 24. The source electrode 22 is provided at the top face side of the semiconductor stacked structure 25. In particular, the source electrode 22 is provided at the opposite side to one side of the p-type GaN body layer 20 at which the InGaN dot buried drift layer 2 is provided. Meanwhile, the drain electrode 23 is provided at the back face side of the n-type GaN substrate 1. In particular, the drain electrode 23 is provided at the opposite side to one side of the n-type GaN substrate 1 at which the InGaN dot buried drift layer 2 is provided. Further, the gate electrode 24 is provided at the top face side of the semiconductor stacked structure 25, namely, at the side at which the source electrode 22 is provided. In particular, the gate electrode 24 is provided in a gate trench 26, which extends from the contact layer 21 configuring the top face of the semiconductor stacked structure 25 to the InGaN dot buried drift layer 2, with an insulating film 27 interposed therebetween. Further, the n-type GaN substrate 1 is provided at the opposite side to one side of the InGaN dot buried drift layer 2 at which the p-type GaN body layer 20 is provided. It is to be noted that the n-type GaN buffer layer 5 may be provided as occasion demands.

It is to be noted that, in the present embodiment, the cathode electrode 4 provided in the GaN based Schottky barrier diode region 30 and the drain electrode 23 provided in the GaN based vertical transistor region 31 are formed as a common electrode 32. The common electrode 32 is referred to also as drain/cathode electrode. Further, the insulating film 11 provided in the GaN based Schottky barrier diode region 30 and the insulating film 27 provided in the GaN based vertical transistor region 31 are formed as a common insulating film 33.

In the present embodiment, the InGaN dot buried drift layer 2 is configured similarly to that of the first embodiment described hereinabove.

Further, in the GaN based Schottky barrier diode region 30, the anode electrode 3 is joined by Schottky junction to the InGaN dot buried drift layer 2 similarly as in the first embodiment described hereinabove. Therefore, in the InGaN dot buried drift layer 2 in the GaN based Schottky barrier diode region 30, in comparison with the drift layer (n-GaN single drift structure) having a normal structure, the region in which the quantum dots 6 are juxtaposed in the vertical direction is converted into P type by a potential lifting effect by the Schottky barrier and the negative fixed charge at the substrate side.

Meanwhile, in the GaN based vertical transistor region 31, the p-type GaN body layer 20 contacts with the InGaN dot buried drift layer 2 similarly as in the second embodiment described hereinabove. Therefore, in the structure including the InGaN dot buried drift layer 2 in the GaN based vertical transistor region 31, in comparison with a structure including a drift layer (n-GaN single drift structure) having a normal structure, the region in which the quantum dots 6 are juxtaposed in the vertical direction is converted into P type by a potential lifting effect by the p-type GaN body layer 20 and the negative fixed charge at the substrate side.

It is to be noted that details of the configuration of the other part are similar to those of the first and second embodiments described hereinabove, and therefore, description of them is omitted here.

Now, a fabrication method for a semiconductor device according to the present embodiment is described with reference to FIGS. 13A to 13D and 14A to 14D.

The present fabrication method for a semiconductor device includes a step of stacking a plurality of quantum dot layers 8 each including an InGaN quantum dot 6 and a GaN burying layer 7 burying the InGaN quantum dot 6 therein to form the drift layer 2. In the present embodiment, the step of forming the drift layer 2 includes a step of forming the InGaN quantum dot 6 on a polar face (here, a Ga polar face) of n-type GaN layers 1, 5 and 7 (first semiconductor layers) and another step of burying the InGaN quantum dot 6 with the n-type GaN layer 7 (second semiconductor layer). The fabrication method further includes a step of forming the p-type GaN body layer 20 (p-type semiconductor layer) contacting with the drift layer 2 after the step of forming the drift layer 2. The present fabrication method further includes a step of forming the anode electrode 3 to be joined by Schottky junction to the drift layer 2 after the step of forming the drift layer 2.

The present fabrication method is described below particularly.

Figure 13A:
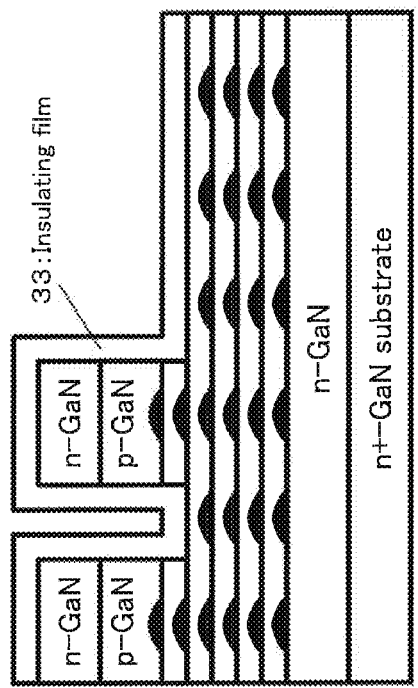
FIGS. 13A to 13D are schematic sectional views illustrating a fabrication method for a semiconductor device according to the third embodiment.

First, the n-GaN buffer layer 5, InGaN dot buried drift layer 2, p-GaN body layer 20 and n-GaN contact layer 21 are grown by crystal growth on the n$^+$-GaN (0001) substrate 1 as depicted in FIG. 13A, for example, by a PAMBE method to form the semiconductor stacked structure 25 similarly as in the second embodiment described hereinabove.

Figure 13C:
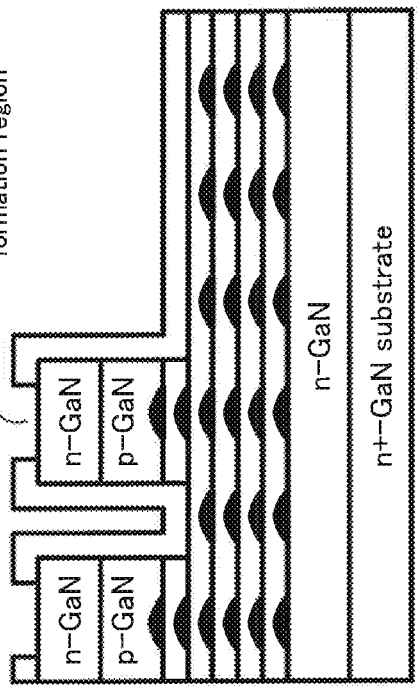
Figure 13B:
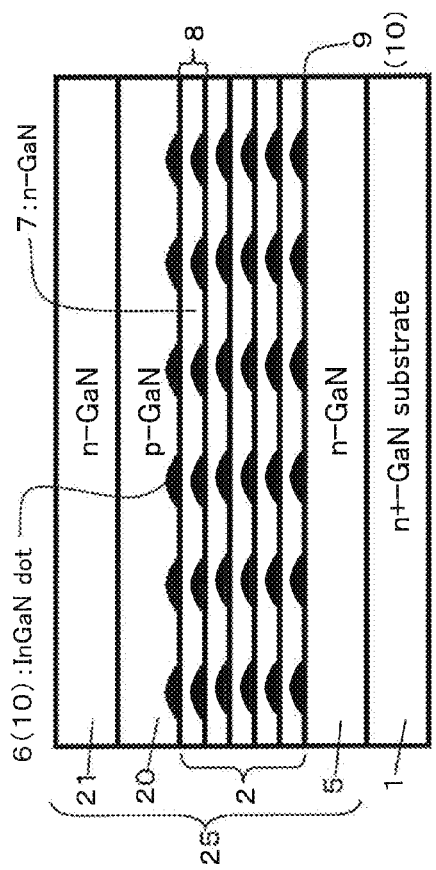

Then, the gate trench 26 is formed in the GaN based vertical transistor region 31 and the Schottky region (Schottky face) 12 is formed in the GaN based Schottky barrier diode region 30 as depicted in FIG. 13B.

In particular, patterning is performed such that the resist 28 may remain in a region other than a region in which the gate trench 26 and the Schottky face 12 are to be formed. Then, the n-GaN contact layer 21, the p-GaN body layer 20 and part of the InGaN dot buried drift layer 2 is removed, for example, by chlorine based dry etching to form the gate trench 26 and the Schottky face 12. Thereafter, the resist 28 is removed.

Then, the insulating film 33 that functions as the passivation film 11 that cover the top face of the semiconductor stacked structure 25 and the gate insulating film 27 is formed as depicted in FIG. 13C. In particular, the insulating film 33, for example, of SiO$_2$, SiN or AlO is deposited on the overall wafer face, for example, by a plasma CVD method or an ALD method. Here, the thickness of the insulating film 33 is approximately 50 nm.

Figure 13D:
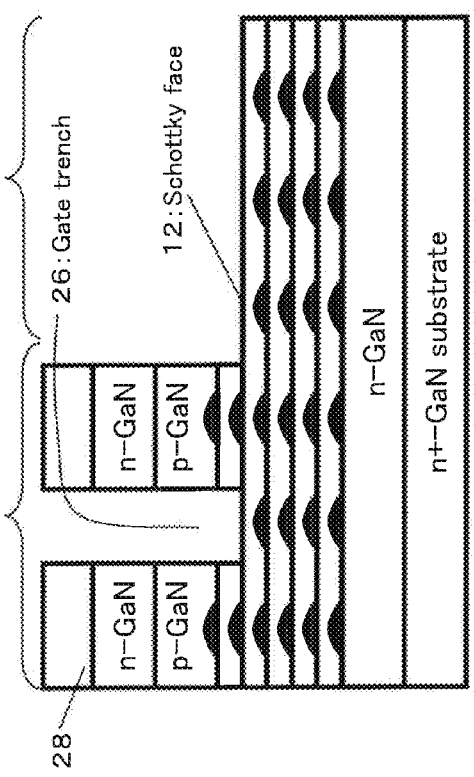

Then, the source electrode 22 is formed at the top face side of the semiconductor stacked structure 25 of the GaN based vertical transistor region 31, and the drain/cathode electrode 32 that functions as the drain electrode 23 in the GaN based vertical transistor region 31 and further functions as the cathode electrode 4 in the GaN based Schottky barrier diode region 30 is formed at the back face side of the substrate 1 as depicted in FIGS. 13D and 14A.

In particular, patterning is performed first such that the resist (not depicted) may remain in a region other than the region 22X in which the source electrode 22 is to be formed, and then the insulating film 33 is removed by dry etching using desired gas as depicted in FIG. 13D. Then, the resist is removed, and then the source electrode 22, for example, of Ti/Al is formed at the top face side of the semiconductor stacked structure 25 in the GaN based vertical transistor region 31 as depicted in FIG. 14A, for example, by a vapor deposition and lift-off method. Then, the drain/cathode electrode 32, for example, of Ti/Al is formed on the overall back face of the substrate, for example, by a vapor deposition method. Here, the thickness of Ti/Al is approximately 30 nm/approximately 300 mm. Thereafter, rapid thermal annealing (RTA) is performed at approximately 600° C.

Then, the anode electrode 3 is formed on the Schottky face 12 in the GaN based Schottky barrier diode region 30, and the gate electrode 24 is formed on the insulating film 33 formed on the gate trench 26 of the GaN based vertical transistor region 31 as depicted in FIGS. 14B to 14D.

In particular, in order to expose the top face of the drift layer 2, namely, the Schottky face 12 to which the anode electrode 3 is to be joined by Schottky junction, patterning of resist (not illustrated) is performed first as depicted in FIG. 14B, for example, by photolithography. Then, dry etching of the insulating film 33 is performed to form an opening in the insulating film 33 to expose the Schottky face 12. Then, the resist is removed, and thereafter, the anode electrode 3, for example, of TaN/Cu is formed, for example, by a sputtering method on the Schottky face 12 of the GaN based Schottky barrier diode region 30. Further, the gate electrode 24 is formed on the insulating film 33 formed on the gate trench 26 of the GaN based vertical transistor region 31 as depicted in FIGS. 14C and 14D.

The semiconductor device according to the present embodiment can be fabricated in this manner. In particular, the semiconductor device including the vertical transistor and the Schottky barrier diode that have the InGaN dot buried type drift structure having performances equivalent to those of the vertical transistor and the Schottky barrier diode that have the conventional super-junction type drift structure can be produced. In the vertical transistor and the Schottky barrier diode that have such an InGaN dot buried type drift structure as descried above, the drift layer 2 can be grown consistently as described above. Therefore, the vertical transistor and the Schottky barrier diode can be produced more readily than the vertical transistor and the Schottky barrier diode that have the conventional super-junction type drift structure, and the number of processing steps can be decreased and the cost can be reduced.

Especially, the vertical transistor and the Schottky barrier diode that include the InGaN dot buried drift layer 2 can be produced on the same wafer as described above, and the semiconductor device in which the vertical transistor and the Schottky barrier diode are integrated can be implemented. Further, the number of processing steps when the semiconductor device in which the vertical transistor and the Schottky barrier diode are integrated is fabricated can be decreased and reduction of the cost can be implemented.

Accordingly, the semiconductor device and the fabrication method therefor according to the present embodiment are advantageous in that the semiconductor device having performances equivalent to those where the conventional super-junction type drift structure is adopted, namely, having an on-resistance and a breakdown voltage (reverse direction breakdown voltage) equivalent to those where the conventional super-junction type drift structure is adopted, can be implemented while the fabrication cost and the number of processing steps are decreased.

[Fourth Embodiment]

Now, a semiconductor device and a fabrication method therefor according to a fourth embodiment are described with reference to FIGS. 15 and 16A to 16C.

The semiconductor device according to the present embodiment is different from that of the first embodiment

[refer to FIG. 7B] described above in that an n-type GaN contact layer 40 is provided in place of the n-type GaN substrate 1.

Figure 15:
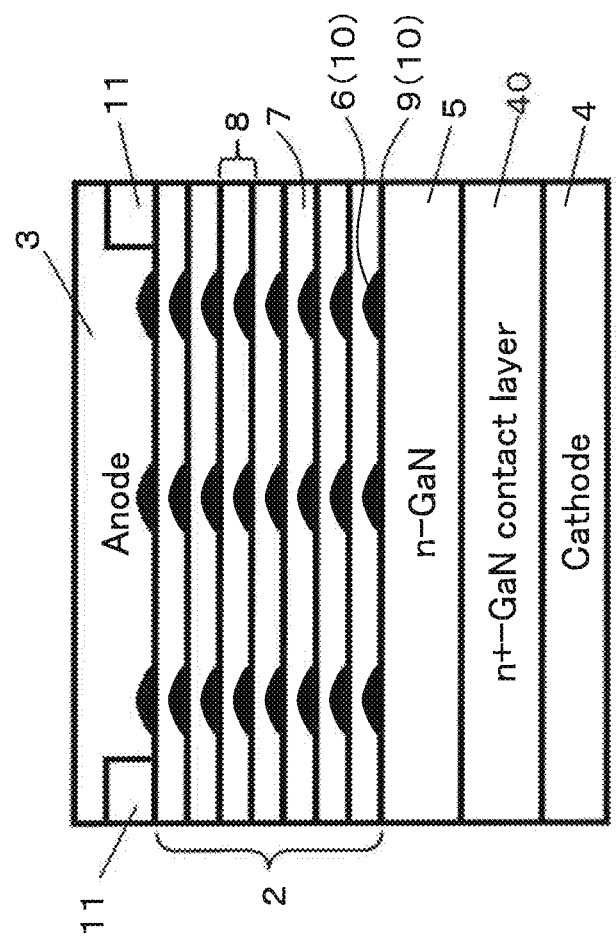
FIG. 15 is a schematic sectional view depicting a configuration of a semiconductor device according to a fourth embodiment.

As depicted in FIG. 15, a present GaN based Schottky barrier diode includes the n-type GaN contact layer 40, an n-type GaN buffer layer 5, an InGaN dot buried drift layer 2, an anode electrode 3, and a cathode electrode 4.

Here, the anode electrode 3 is joined by Schottky junction to the InGaN dot buried drift layer 2. Further, the cathode electrode 4 is provided at the back face side (lower surface side) of the n-type GaN contact layer 40. In particular, the cathode electrode 4 is provided at the opposite side to one side of the n-type GaN contact layer 40 at which the InGaN dot buried drift layer 2 is provided. Further, the n-type GaN contact layer 40 is provided at the opposite side to one side of the InGaN dot buried drift layer 2 at which the anode electrode 3 is provided. It is to be noted that the n-type GaN buffer layer 5 may be provided as occasion demands.

It is to be noted that details of the configuration of the other part are similar to those of the first embodiment described above, and therefore, description of them is omitted here.

Now, a fabrication method for a semiconductor device according to the present embodiment is described with reference to FIGS. 16A to 16C.

The present fabrication method for a semiconductor device includes a step of stacking a plurality of quantum dot layers 8 each including an InGaN quantum dot 6 and a GaN burying layer 7 burying the InGaN quantum dot 6 to form the drift layer 2. In the present embodiment, the step of forming the drift layer 2 includes a step of forming the InGaN quantum dot 6 on a polar face (here, a Ga polar face) of n-type GaN layers 1, 5 and 7 (first semiconductor layers) and another step of burying the InGaN quantum dot 6 with the n-type GaN layer 7 (second semiconductor layer). The fabrication method further includes a step of forming the anode electrode 3 to be joined by Schottky junction to the drift layer 2 after the step of forming the drift layer 2.

The fabrication method according to the present embodiment is described below particularly.

Since the semiconductor device configured in such a manner as described above does not include the substrate 1, various substrates can be used as a substrate for growth for the semiconductor device. For example, the semiconductor device can be formed on a substrate such as, for example, a GaN substrate, a sapphire substrate, a silicon carbide (SiC) substrate, a silicon (Si) substrate, an aluminum nitride (AlN) substrate or a zinc oxide (ZnO) substrate.

It is to be noted that, where the semiconductor device is configured so as to include the substrate 1 as in the first embodiment described above, the substrate that can be used for the semiconductor device is limited. Since a substrate such as, for example, a sapphire substrate or an AlN substrate has a low electrical conductivity and a high resistance, they cannot be used for the semiconductor device. Further, while it is possible to form a substrate such as a SiC substrate, a Si substrate or a ZnO substrate as an electrically conductive substrate, since the on-resistance is increased by the discontinuity of the conduction band to a buffer layer or a nucleation layer made of a GaN based semiconductor formed on the substrate, it is not desirable to use the substrates. Therefore, in the first embodiment described hereinabove, the n-type GaN substrate 1 is used as a conductive substrate that does not exhibit a high on-resistance. In this manner, where the semiconductor device is configured so as to include the substrate 1 as in the first embodiment described hereinabove, the substrate that can be used for the semiconductor device is limited.

In the following, the present embodiment is described taking, as an example, a case in which a GaN based Schottky barrier diode including an InGaN dot buried drift layer is fabricated using a sapphire substrate having a high resistance as a substrate for growth.

First, an AlN nucleation layer 42, an n$^+$-GaN contact layer 40, the n-GaN buffer layer 5 and the InGaN dot buried drift layer 2 are grown by crystal growth on a sapphire substrate 41, for example, by a PAMBE method to form a semiconductor stacked structure 43 as depicted in FIG. 16A. Here, the growth temperature of the drift layer 2 is approximately 520° C. and the growth temperature of the layers other than the drift layer 2 is approximately 750° C. Further, the thickness of the n$^+$-GaN contact layer 40 is approximately 1 μm and the impurity concentration is approximately $2 \times 10^{18}$ cm$^{-3}$. Further, the thickness of the n-GaN buffer layer 5 is approximately 0.2 μm and the impurity concentration is approximately $2 \times 10^{17}$ cm$^{-3}$. Further, the InGaN dot buried drift layer 2 is formed by a process similar to that of the first embodiment described above, and the thickness of the drift layer 2 is, for example, approximately 1 μm.

Then, the SiN passivation film 11 is formed on the top face (upper surface) of the semiconductor stacked structure 43 as depicted in FIG. 16B, for example, by a plasma CVD method. Then, the GaN based semiconductor stacked structure 44 including the n$^+$-GaN contact layer 40, n-GaN buffer layer 5 and InGaN dot buried drift layer 2 is separated, for example, using a laser. In particular, the AlN nucleation layer 42 is removed from the semiconductor stacked structure 43 formed in such a manner as described above and the sapphire substrate 41 is separated, for example, by a laser liftoff method thereby to form the GaN based semiconductor stacked structure 44 including the SiN passivation film 11 on the surface thereof. It is to be noted that the GaN based semiconductor stacked structure 44 is referred to also as GaN epitaxial crystal layer.

It is to be noted that the substrate removing method is not limited to this and it is possible to use, for example, photoelectric chemical etching (PEC). Further, where a Si substrate is used as a substrate for growth, also it is possible to use, for example, wet etching.

Then, the cathode electrode 4, for example, of Ti/Al is formed at the back face side (lower surface side) of the separated GaN based semiconductor stacked structure 44, namely, at the back face side (lower surface side) of the n$^+$-GaN contact layer 40, as depicted in FIG. 16C, for example, by a vapor deposition method similarly as in the first embodiment described hereinabove.

Then, similarly as in the first embodiment described hereinabove, an opening is formed in the SiN passivation film 11 to expose the Schottky region 12 therethrough, and then the anode electrode 3, for example, of TaN/Cu is formed, for example, by a sputtering method.

The semiconductor device (GaN based Schottky barrier diode) according to the present embodiment can be fabricated in this manner. In particular, the Schottky barrier diode having the InGaN dot buried type drift structure having performances equivalent to those of the Schottky barrier diode having the conventional super-junction type drift structure can be fabricated. In the Schottky barrier diode including such an InGaN dot buried type drift structure as described above, the drift layer 2 can be grown consistently as described above. Therefore, the Schottky barrier diode according to the present embodiment can be fabricated more readily than the Schottky barrier diode having the conventional super-junction type drift structure, and the number of processing steps can be decreased and the cost can be reduced.

Especially, since the substrate 41 and the nucleation layer 42 are removed and the cathode electrode 4 is electrically connected to the n$^+$-GaN contact layer 40 as described above, even if various substrates such as the sapphire substrate 41 having a high resistance are used as a substrate for growth, a Schottky barrier diode similar to that of the first embodiment described hereinabove can be fabricated.

Accordingly, the semiconductor device and the fabrication method therefor according to the present embodiment are advantageous in that a semiconductor device having performances equivalent to those where the conventional super-junction type drift structure is adopted, namely, having an on-resistance and a breakdown voltage (reverse direction breakdown voltage) equivalent to those where the conventional super-junction type drift structure is adopted, can be implemented while the fabrication cost and the number of processing steps are decreased.

It is to be noted that, while the present embodiment is described as a modification to the first embodiment described hereinabove, the present embodiment is not limited to this and can be configured also as a modification to the second or third embodiment described hereinabove. In other words, the configuration according to the present embodiment can be applied to those of the second and third embodiments described hereinabove.

[Fifth Embodiment]

Now, a semiconductor device and a fabrication method therefor according to a fifth embodiment are described with reference to FIGS. 17 and 18A to 18C.

Figure 17:
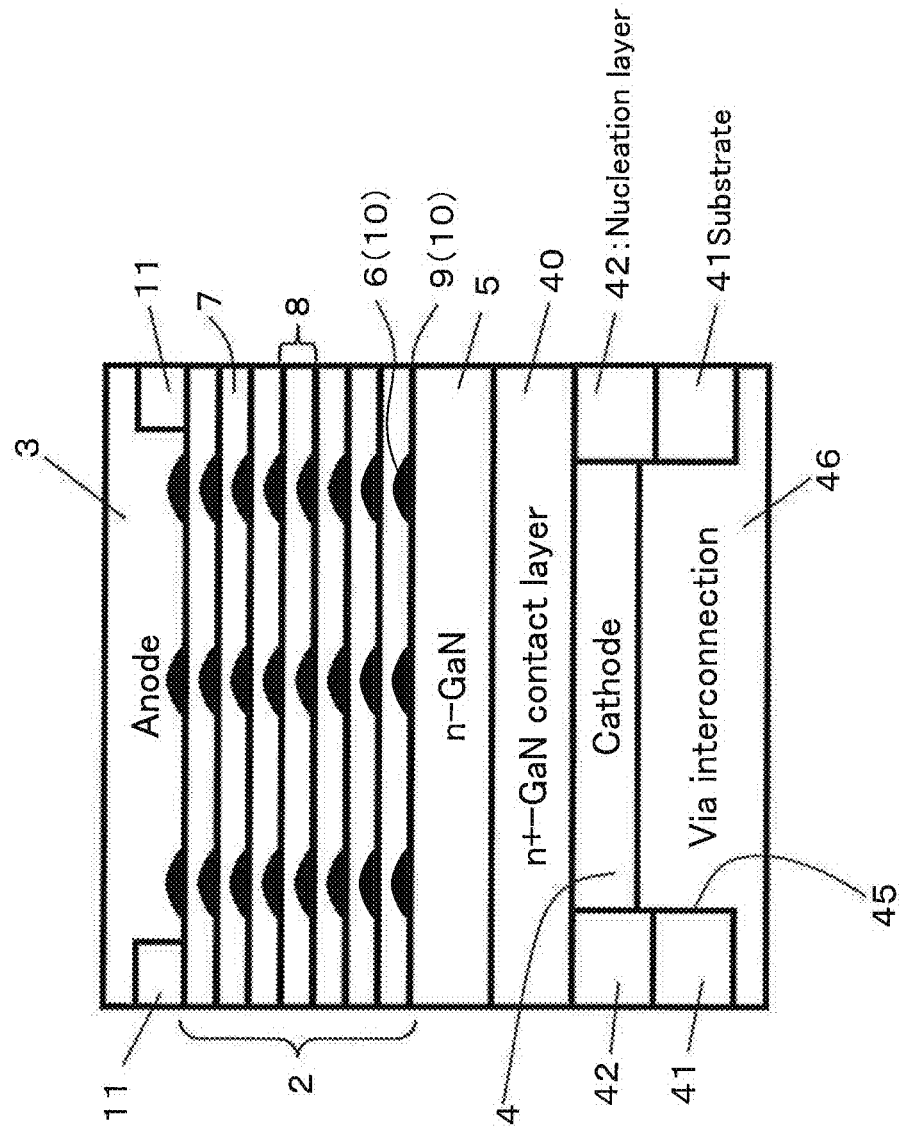
FIG. 17 is a schematic sectional view depicting a configuration of a semiconductor device according to a fifth embodiment.

The semiconductor device according to the present embodiment is different from that of the fourth embodiment (refer to FIG. 15) described hereinabove in that the substrate 41 and the nucleation layer 42 are left and a via hole 45 and a via interconnection 46 are provided as depicted in FIG. 17. It is to be noted that the present embodiment is described taking, as an example, a case in which a Si substrate is used as the substrate (substrate for growth) 41.

The present GaN based Schottky barrier diode includes a Si substrate 41, an AlN nucleation layer 42, an n-type contact layer 40, an n-type GaN buffer layer 5, an InGaN dot buried drift layer 2, an anode electrode 3, a cathode electrode 4, a via hole 45, and a via interconnection 46.

Here, the anode electrode 3 is joined by Schottky junction to the InGaN dot buried drift layer 2. Further, the cathode electrode 4 is provided at the back face side (lower surface side) of the n-type GaN contact layer 40. In particular, the cathode electrode 4 is provided at the opposite side to one side of the n-type GaN contact layer 40 at which the InGaN dot buried drift layer 2 is provided. Further, the n-type GaN contact layer 40 is provided at the opposite side to one side of the InGaN dot buried drift layer 2 at which the anode electrode 3 is provided. Further, the Si substrate 41 is provided at the opposite side to one side of the n-type GaN contact layer 40 at which the InGaN dot buried drift layer 2 is provided. Further, the via hole 45 is provided in the Si substrate 41 and the AlN nucleation layer 42. In particular, the via hole 45 is provided so as to extend through the Si substrate 41 and the AlN nucleation layer 42. Further, the cathode electrode 4 and the via interconnection 46 electrically connected to the cathode electrode 4 are provided in the via hole 45. It is to be noted that the n-type GaN buffer layer 5 may be provided as occasion demands.

If the substrate 41 is removed completely as in the fourth embodiment described hereinabove, then there is the possibility that the strength of the chip may decrease significantly. However, the chip strength can be increased if the semiconductor device is configured in such a manner as in the present embodiment.

It is to be noted that details of the configuration of the other part are similar to those of the fourth embodiment described above, and therefore, description of them is omitted here.

Now, a fabrication method for a semiconductor device according to the present embodiment is described with reference to FIGS. 18A to 18C.

The present fabrication method for a semiconductor device includes a step of stacking a plurality of quantum dot layers 8 each including an InGaN quantum dot 6 and a GaN burying layer 7 burying the InGaN quantum dot 6 thereinto form a drift layer 2. In the present embodiment, the step of forming the drift layer 2 includes a step of forming the InGaN quantum dot 6 on a polar face (here, a Ga polar face) of n-type GaN layers 1, 5 and 7 (first semiconductor layers), and a step of burying the InGaN quantum dot 6 with the n-type GaN layer 7 (second semiconductor layer). The present fabrication method further includes a step of forming an anode electrode 3 joined to the drift layer 2 by Schottky joint after the step of forming the drift layer 2.

The present fabrication method for a semiconductor device is described particularly.

First, the AlN nucleation layer 42, n$^+$-GaN contact layer 40, n-GaN buffer layer 5 and InGaN dot buried drift layer 2 are grown by crystal growth on a Si substrate 41 as depicted in FIG. 18A, for example, by a metal organic chemical vapor deposition (MOCVD) method. Here, after the AlN nucleation layer 42, n$^+$-GaN contact layer 40 and n-GaN buffer layer 5 are grown by crystal growth at a growth temperature of approximately 1050° C., the growth temperature is lowered to approximately 670° C. and the InGaN dot buried drift layer 2 is grown by crystal growth. The n$^+$-GaN contact layer 40 has a thickness of approximately 1 μm and has an impurity concentration of approximately $2 \times 10^{18}$ cm$^{-3}$. Meanwhile, the n-GaN buffer layer 5 has a thickness of approximately 0.2 μm and an impurity concentration of approximately $2 \times 10^{17}$ cm$^{-3}$. Further, the InGaN dot buried drift layer 2 is formed by a step similar to that in the first embodiment described hereinabove and has a thickness of, for example, approximately 1 μm.

Then, the via hole 45 that extends from the back face of the Si substrate 41 to the n$^+$-GaN contact layer 40 is formed as depicted in FIG. 18B, for example, by dry etching. In other words, the via hole 45 that extends through the Si substrate 41 and the AlN nucleation layer 42 is formed.

Then, the cathode electrode 4, for example, of Ti/Al is formed at the back face side of the n$^+$-GaN contact layer 40 exposed to the region in which the via hole 45 is formed as depicted in FIG. 18C, for example, by a vapor deposition method.

Then, the via interconnection 46 electrically connected to the cathode electrode 4 formed in the via hole 45 is formed. In particular, the via interconnection 46 is formed at the back face side (lower surface side) of the cathode electrode 4, for example, by Ti/Cu sputtering and Cu buried plating.

Then, the SiN passivation film 11 is formed on the top face of a semiconductor stacking structure 43, for example, by a plasma CVD method. Then, the opening is formed in the SiN passivation film 11 to expose the Schottky region 12, and then the anode electrode 3, for example, of TaN/Cu is formed, for example, by a sputtering method.

The semiconductor device (GaN based Schottky barrier diode) according to the present embodiment can be fabricated in this manner. In other words, the Schottky barrier diode having performances equivalent to those of the Schottky barrier diode having the conventional super-junction type drift structure can be fabricated. In the Schottky barrier diode having such an InGaN dot buried type drift structure as described above, the drift layer 2 can be grown by consistent growth as described hereinabove. Therefore, the Schottky barrier diode can be fabricated more readily than the Schottky barrier diode having the conventional super-junction type drift structure and besides by a reduced number of processing steps and at a reduced cost.

Especially, the cathode electrode 4 electrically connected to the $n^+$-GaN contact layer 40 is formed in the via hole 45 formed by removing the substrate 41 and the nucleation layer 42 in such a manner as described above, and the via interconnection 46 is electrically connected to the cathode electrode 4. Consequently, a Schottky barrier diode similar to that in the first embodiment can be fabricated while the chip strength is assured using various substrates such as a Si substrate as the substrate 41.

Accordingly, the semiconductor device and the fabrication method therefor according to the present embodiment are advantageous in that a semiconductor device having performances equivalent to those in an alternative case in which the conventional super-junction type drift structure is adopted, namely, having an equivalent on-resistance and an equivalent breakdownvoltage (reverse direction breakdown voltage), can be implemented while the fabrication cost and the number of processing steps are reduced.

It is to be noted that the embodiment described above is described as a modification to the fourth embodiment described hereinabove, and the fourth embodiment described above is described as a modification to the first embodiment. However, the fifth embodiment described above is not limited to this and may be configured as a modification to the second or third modification described hereinabove. In other words, the semiconductor device according to the present fifth embodiment can be applied to those according to the second and third embodiments described hereinabove.

Further, while the fifth embodiment is described above taking, as an example, a case in which a Si substrate is used as the substrate 41, the substrate 41 is not limited to this. In particular, it is possible to use a substrate of GaN, SiC, AlN, ZnO or sapphire for which via hole processing can be carried out similarly as in the case of the fourth embodiment described hereinabove.

[Sixth Embodiment]

In the following, a semiconductor device and a fabrication method therefor as well as a power supply apparatus according to a sixth embodiment are described with reference to FIGS. 19A, 19B, 20A and 20B.

The semiconductor device according to the present embodiment is a semiconductor package that includes the semiconductor device (Schottky barrier diode or vertical transistor) of any of the embodiments and the modifications to the embodiments described hereinabove as a semiconductor chip.

It is to be noted that a semiconductor chip including a Schottky barrier diode includes an interlayer insulating film and an interconnection layer including an interconnection and an electrode pad, and the electrode pad is electrically connected to the anode electrode of the individual Schottky barrier diode through the interconnection. Meanwhile, a semiconductor chip that includes a vertical transistor includes an interlayer insulating film and an interconnection layer including an interconnection and an electrode pad, and a source pad and a gate pad are electrically connected to the source electrode and the gate electrode of the individual vertical transistor through the interconnections, respectively.

In the following, description is given taking a discrete package as an example.

First, as depicted in FIG. 19A, the discrete package including a semiconductor chip including a Schottky barrier diode includes a stage 50 on which a semiconductor chip 55 including the Schottky barrier diode of any of the embodiments and the modifications to the embodiments described hereinabove is mounted. The discrete package further includes an anode lead 51, a cathode lead 52, a bonding wire 53 (here, an Al wire), and an encapsulation resin 54. It is to be noted that the encapsulation resin 54 is referred to also as mold resin.

An anode pad 56 of the semiconductor chip 55 mounted on the stage 50 is connected to the anode lead 51 by the Al wire 53. Meanwhile, the cathode electrode 4 provided on the overall back face (lower surface) of the semiconductor chip 55 is fixed to the stage 50 by die attach material 57 (here, solder) and is electrically connected to the cathode lead 52 through the stage 50. These undergo resin encapsulation. It is to be noted that the die attach material 57 is referred to also as mounting material. Further, the stage 50 is referred to also as package electrode table.

Such a discrete package as described above can be fabricated in the following manner.

First, the semiconductor chip 55 including the Schottky barrier diode of any of the embodiments and the modifications to the embodiments described hereinabove is fixed to the stage 50 of a lead frame using, for example, the die attach material 57 (here, solder). Consequently, the cathode electrode 4 provided on the overall back face of the semiconductor chip 55 is electrically connected to the cathode lead 52 through the die attach material 57 and the stage 50.

Then, the anode pad 56 of the semiconductor chip 55 is connected to the anode lead 51 by bonding using, for example, the Al wire 53.

Thereafter, resin encapsulation is performed, for example, by a transfer molding method, and then, the lead frame is cut away.

The discrete package described hereinabove can be fabricated in this manner.

It is to be noted that, while description is given taking a discrete package in which the pad 56 of the semiconductor chip 55 is used as a bonding pad for wire bonding as an example, the semiconductor package is not limited to this, but also may be some other semiconductor package. For example, the semiconductor package may be a semiconductor package in which pads of the semiconductor chip are used as bonding pads for wireless bonding such as, for example, flip-chip bonding. Or, the semiconductor package may be a wafer level package. Or else, the semiconductor package may be a semiconductor package other than a discrete package.

As depicted in FIG. 19B, the discrete package that includes a semiconductor chip including a vertical transistor includes a stage 60 on which a semiconductor chip 66 including the vertical transistor of any of the embodiments and the modifications described hereinabove is mounted. The discrete package further includes a gate lead 61, a source lead 62, a drain lead 63, bonding wires 64 (here, Al wires), and an encapsulation resin 65. It is to be noted that the encapsulation resin 65 is referred to also as mold resin.

A gate pad 67 and a source pad 68 provided at the top face side (upper surface side) of the semiconductor chip 66 mounted on the stage 60 are connected to the gate lead 61 and the source lead 62 by the Al wires 64, respectively. Further, a drain electrode 23 provided on the overall back face (lower surface) of the semiconductor chip 66 is fixed to the stage 60 by die attach material 69 (here, solder) and is electrically connected to the drain lead 63 through the stage 60. These undergo resin encapsulation.

Such a discrete package as described above can be fabricated in the following manner.

First, the semiconductor chip 66 including the vertical transistor of any of the embodiments and the modifications to the embodiments described hereinabove is fixed to the stage 60 of the lead frame using, for example, the die attach material 69 (here, solder). Consequently, the drain electrode 23 provided on the overall back face of the semiconductor chip 66 is electrically connected to the drain lead 63 through the die attach material 69 and the stage 60.

Then, the gate pad 67 of the semiconductor chip 66 is connected to the gate lead 61 and the source pad 68 is connected to the source lead 62 by bonding using, for example, the Al wires 64.

Thereafter, resin encapsulation is performed, for example, by a transfer molding method, and then the lead frame is cut away.

The discrete package described hereinabove can be fabricated in this manner.

It is to be noted that, while the description here is given taking the discrete package wherein the pads 67 and 68 of the semiconductor chip 66 are used as bonding pads for wire bonding as an example, the semiconductor package is not limited to the discrete package, but may be a different semiconductor package. For example, a semiconductor package may be applied wherein pads of a semiconductor chip are used as bonding pads for wireless bonding such as, for example, flip-chip bonding. Or, the semiconductor package may be a wafer level package. Or else, the semiconductor package may be a semiconductor package other than a discrete package.

Now, a power supply apparatus that includes the semiconductor package including a Schottky barrier diode or a vertical transistor described hereinabove is described with reference to FIGS. 20A and 20B.

Figure 20A:
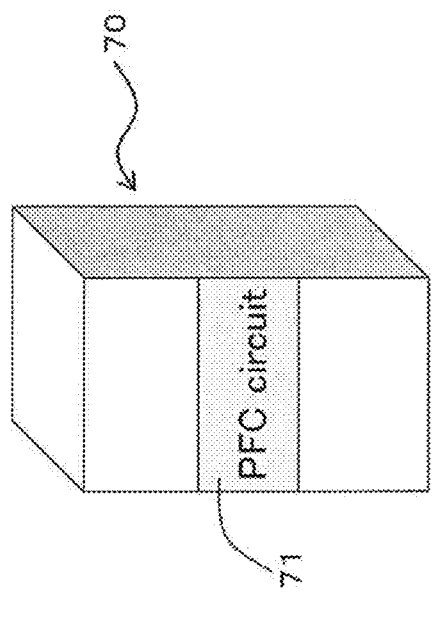
FIGS. 20A and 20B are schematic views depicting a configuration of a power supply apparatus according to the sixth embodiment.

In the following, a power supply apparatus is described taking a case in which the Schottky barrier diode included in the semiconductor package described hereinabove and the vertical transistor included in the semiconductor package described hereinabove are used for a PFC (power factor correction) circuit 71 provided in such a power supply apparatus 70 used in a server or a server system as depicted in FIG. 20A as an example.

Figure 20B:
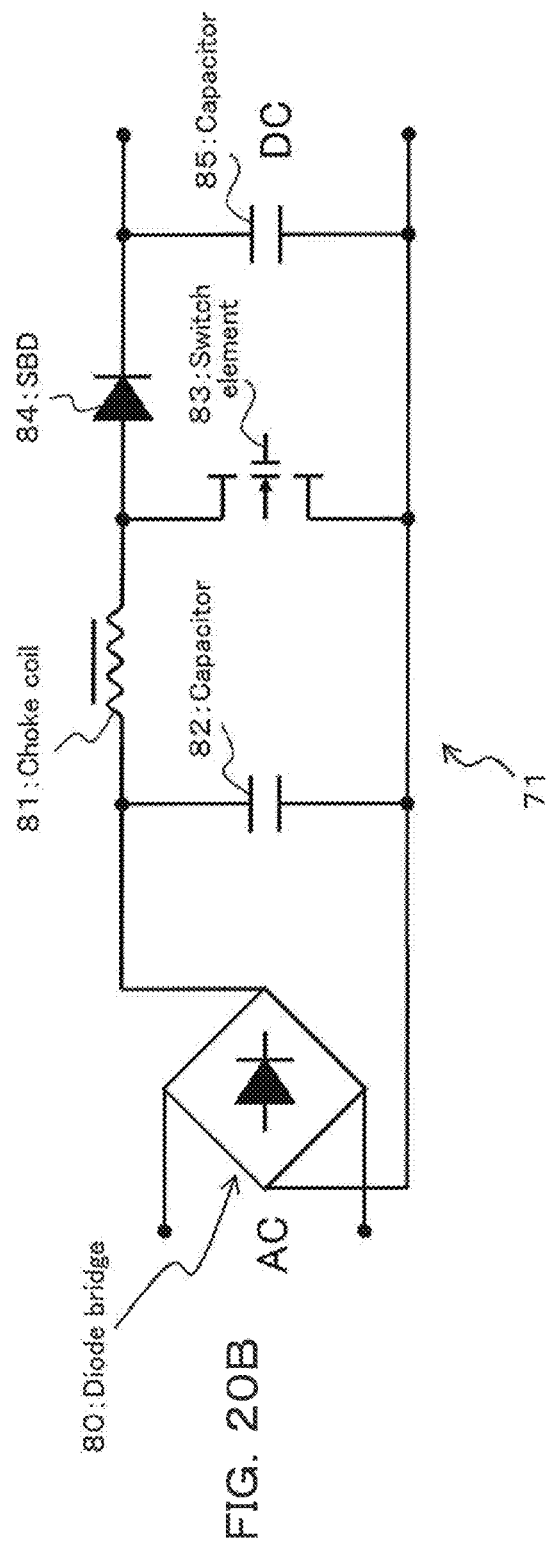
Figure 21:
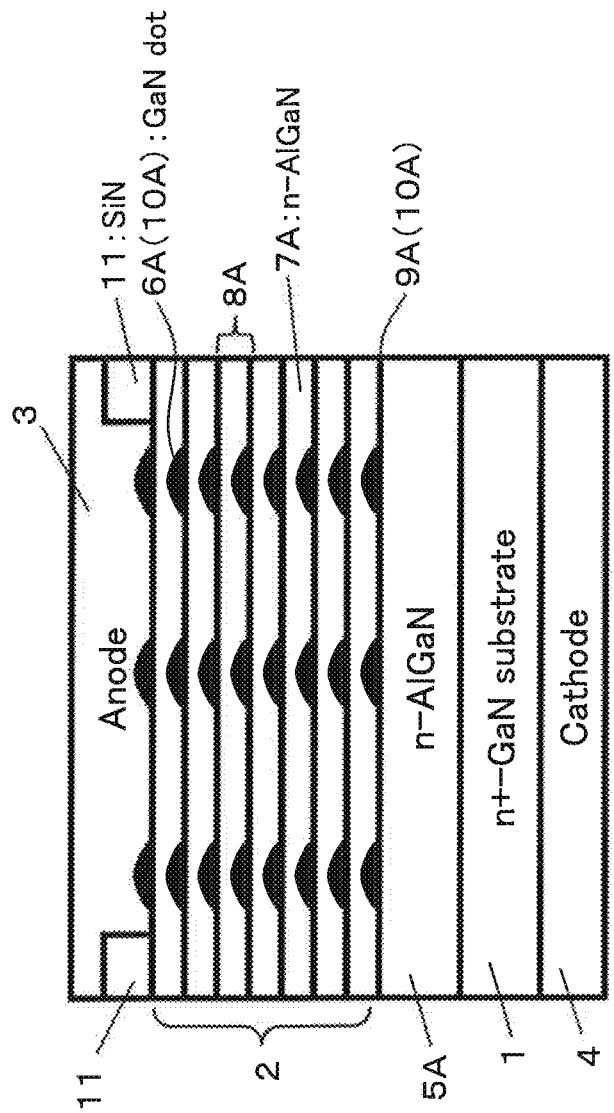
FIG. 21 is a schematic sectional view depicting a configuration of a semiconductor device according to a modification to the first embodiment.
Figure 22:
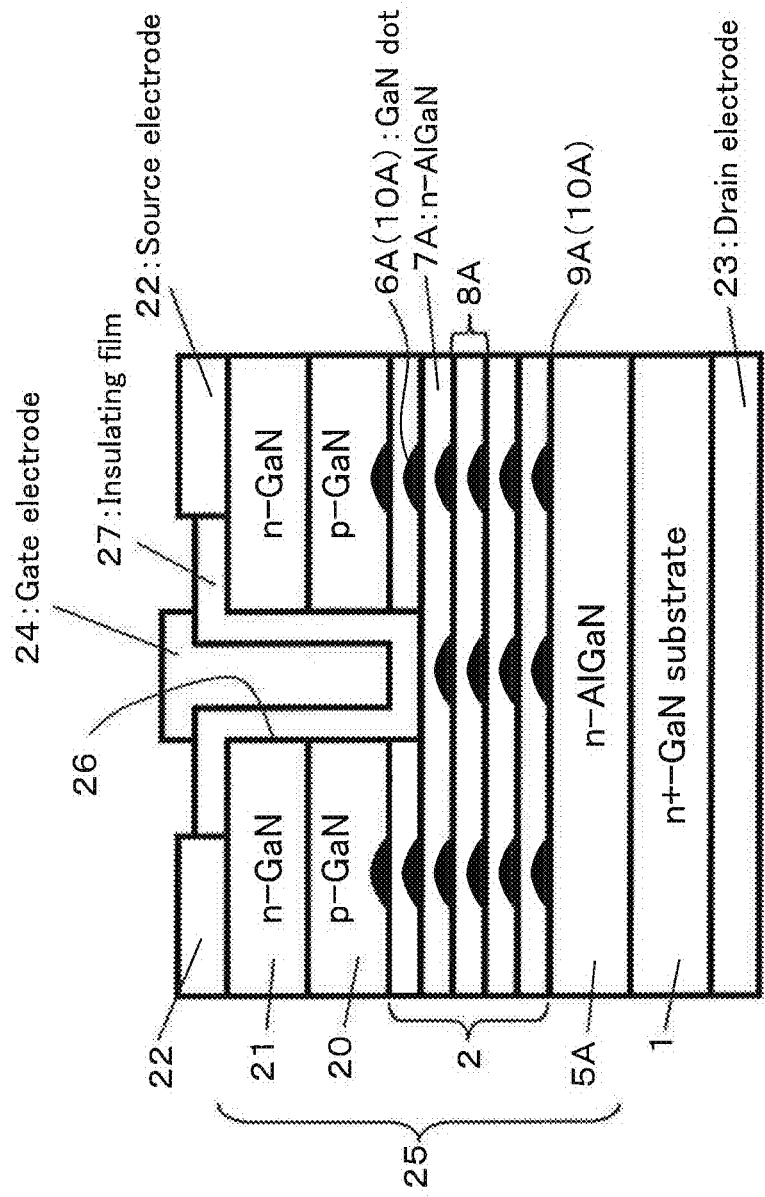
FIG. 22 is a schematic sectional view depicting a configuration of a semiconductor device according to a modification to the second embodiment.
Figure 23:
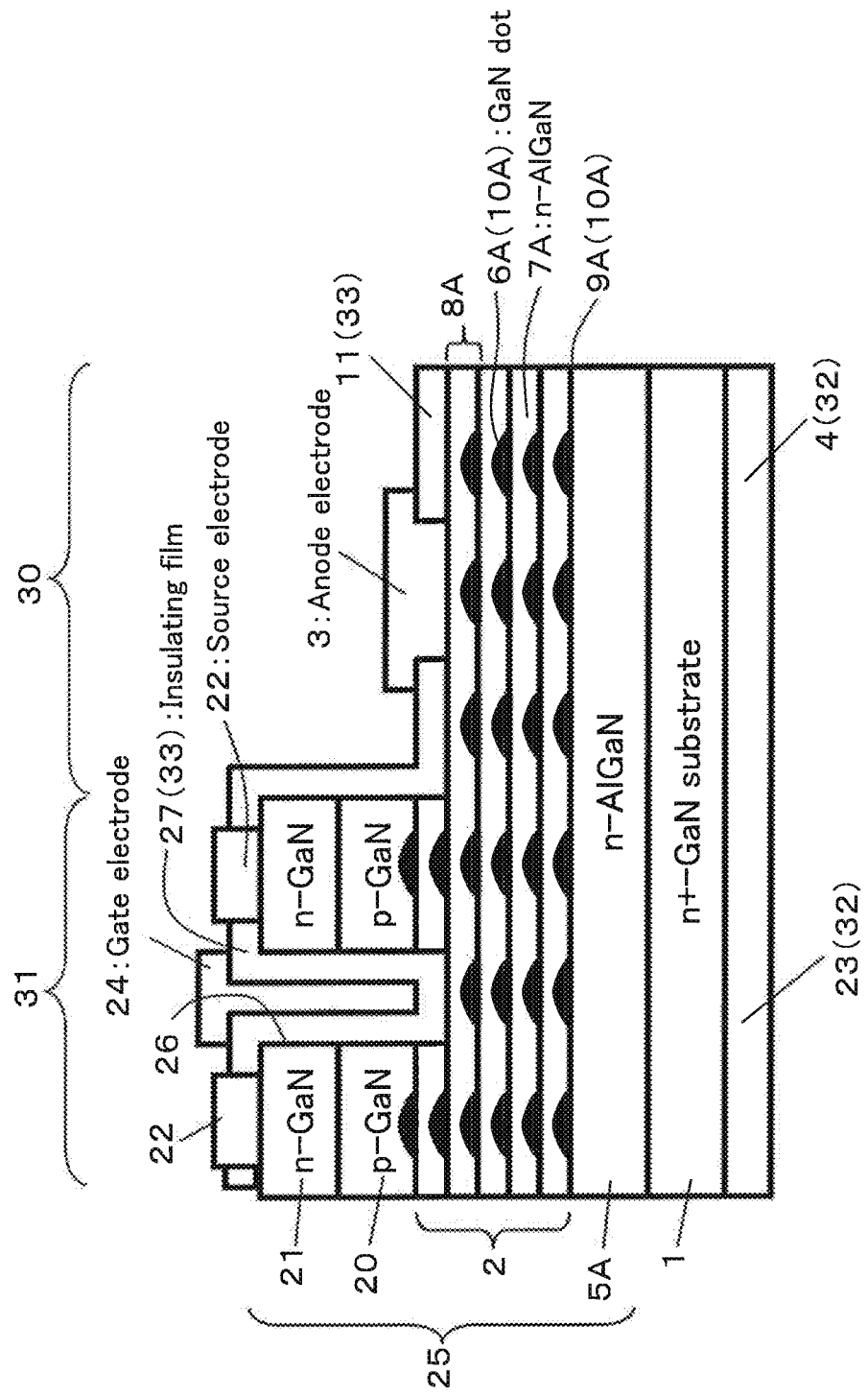
FIG. 23 is a schematic sectional view depicting a configuration of a semiconductor device according to a modification to the third embodiment.
Figure 24:
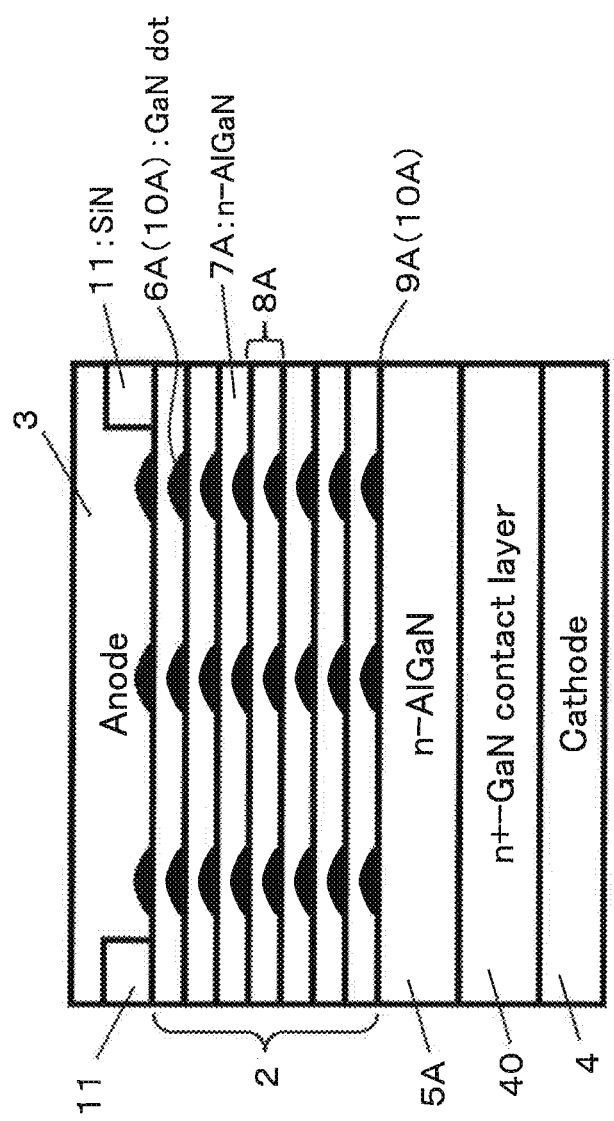
FIG. 24 is a schematic sectional view depicting a configuration of a semiconductor device according to a modification to the fourth embodiment.
Figure 25:
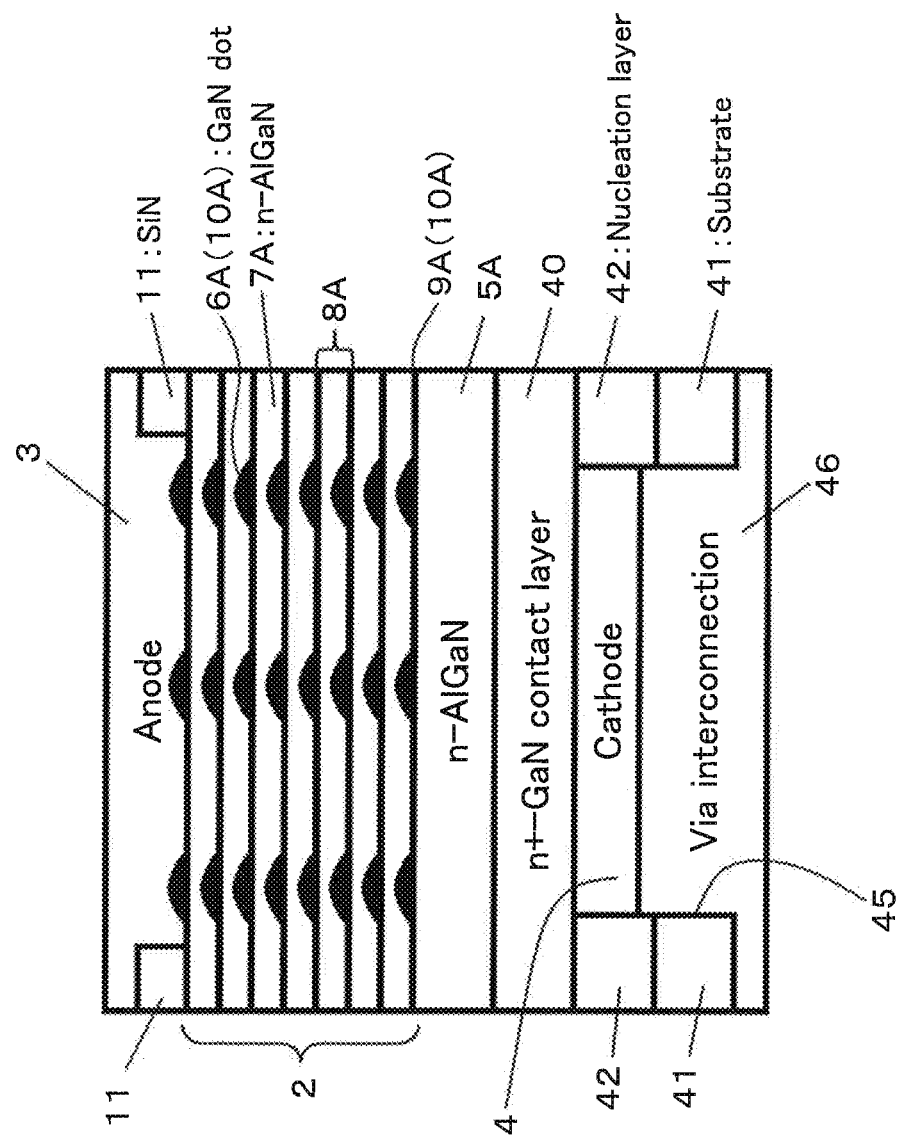
FIG. 25 is a schematic sectional view depicting a configuration of a semiconductor device according to a modification to the fifth embodiment.

As depicted in FIG. 20B, the present PFC circuit 71 includes a diode bridge 80, a choke coil 81, a first capacitor 82, a vertical transistor 83 (switch element) included in the semiconductor package described hereinabove, a Schottky barrier diode (SBD) 84 included in the semiconductor package described hereinabove, and a second capacitor 85.

Here, the present PFC circuit 71 is configured such that the diode bridge 80, choke coil 81, first capacitor 82, vertical transistor 83 included in the semiconductor package described hereinabove, Schottky barrier diode 84 included in the semiconductor package described hereinabove, and second capacitor 85 are mounted on a circuit board.

In the present embodiment, the drain lead 63, source lead 62 and gate lead 61 of the semiconductor package described hereinabove are inserted in a drain lead insertion portion, a source lead insertion portion and a gate lead insertion portion of the circuit board and fixed, for example, by solder and so forth. In this manner, the vertical transistor 83 included in the semiconductor package described hereinabove is connected to the PFC circuit 71 formed on the circuit board.

Further, in the present embodiment, the anode lead 51 and the cathode lead 52 of the semiconductor package described hereinabove are inserted in an anode lead insertion portion and a cathode lead insertion portion of the circuit board, respectively, and fixed, for example, by solder and so forth. In this manner, the Schottky barrier diode 84 included in the semiconductor package described hereinabove is connected to the PFC circuit 71 formed on the circuit board.

Further, in the present PFC circuit 71, one of the terminals of the choke coil 81 and the anode electrode 3 of the Schottky barrier diode 84 are connected to the drain electrode 23 of the vertical transistor 83. Meanwhile, one of the terminals of the first capacitor 82 is connected to the other terminal of the choke coil 81, and one of the terminals of the second capacitor 85 is connected to the cathode electrode 4 of the Schottky barrier diode 84. The other terminal of the first capacitor 82, the source electrode 22 of the vertical transistor 83 and the other terminal of the second capacitor 85 are grounded. Further, a pair of terminals of the diode bridge 80 are connected to the opposite terminals of the first capacitor 82, and the other pair of terminals of the diode bridge 80 are connected to input terminals to which an alternating voltage (AC voltage) is inputted. The opposite terminals of the second capacitor 85 are connected to output terminals, from which a direct current (DC) voltage is outputted. A gate driver not depicted is connected to the gate electrode 24 of the vertical transistor 83. In the present PFC circuit 71, the vertical transistor 83 is driven by the gate driver to convert an AC voltage inputted from the input terminals into a DC voltage, which is outputted from the output terminals.

Accordingly, the power supply apparatus according to the present embodiment is advantageous in that the reliability can be improved. In particular, the power supply apparatus includes the semiconductor chip 55 that includes a Schottky barrier diode or a vertical transistor of any of the embodiments and the modifications to the embodiments described hereinabove, which have performances equivalent to those of the conventional super-junction type drift structure, namely, have an on-resistance and a breakdown voltage (reverse direction breakdown voltage) equivalent to those of the conventional super-junction type drift structure while the fabrication cost and the number of processing steps are reduced. Therefore, the power supply apparatus having high reliability while the fabrication cost and the number of processing steps are reduced can be constructed.

It is to be noted that, although the description here is given taking a case in which the semiconductor device described above (a Schottky barrier diode, a vertical transistor, or a semiconductor package including a Schottky barrier diode or a vertical transistor) is used in the PFC circuit 71 provided in the power supply apparatus 70 used in a server or a server system as an example, the application of the semiconductor device is not limited to this. For example, the semiconductor device described above (a Schottky barrier diode, a vertical transistor, or a semiconductor package including a Schottky barrier diode or a vertical transistor) may otherwise be used in an electronic equipment (electronic apparatus) such as a computer other than a server or a server system. Alternatively, the semiconductor device (semiconductor package) described hereinabove may be used in a different circuit (for example, in a DC-DC converter) provided in a power supply apparatus.

[Others]

It is to be noted that the present invention is not limited to the configurations described in connection with the embodiments and the modifications described hereinabove but can be modified in various manners without departing from the spirit and scope of the present invention.

For example, in the embodiments and the modifications described hereinabove, the drift layer 2 has a structure that a plurality of quantum dot layers 8 each including an InGaN quantum dot 6 and an n-type GaN burying layer 7 burying the InGaN quantum dot 6 are stacked. However, the structure of the drift layer 2 is not limited to this.

For example, a burying layer containing InAlN or InAlGaN having a lattice constant equal to that of GaN may be used in place of the GaN burying layer. Also in this case, similar effects to those achieved by the embodiments and the modifications described hereinabove can be achieved. Or, for example, an AlGaN burying layer 7A may be used in place of the GaN burying layer while a GaN quantum dot 6A is used in place of the InGaN quantum dot as depicted in FIGS. 21 to 25. Also in this case, similar effects to those achieved by the embodiments and the modifications described hereinabove can be achieved. In this case, the drift layer 2 includes a plurality of stacked quantum dot layers 8A each including the GaN layer 10A, which includes the GaN quantum dot 6A and the GaN wetting layer 9A, and the AlGaN burying layer 7A. Further, an AlGaN layer 5A is used in place of the GaN buffer layer.

In short, the drift layer 2 may have a structure that a plurality of quantum dot layers each including a quantum dot containing $In_xGa_{1-x}N$ ($0 \leq x \leq 1$) and a burying layer burying the quantum dot and containing n-type $In_x(Ga_yAl_{1-y})_{1-x}N$ ($0 \leq x \leq 1, 0 \leq y \leq 1$) are stacked.

In this case, the fabrication method for a semiconductor device may include a step of forming a drift layer by stacking a plurality of quantum dot layers each including a quantum dot containing $In_xGa_{1-x}N$ ($0 \leq x \leq 1$) and a burying layer burying the quantum dot and containing n-type $In_x(Ga_yAl_{1-y})_{1-x}N$ ($0 \leq x \leq 1, 0 \leq y \leq 1$).

It is to be noted that the material for the quantum dot and the burying layer is selected such that the lattice constant of the quantum dot is higher than that of the burying layer. In particular, the quantum dot has a lattice constant higher than that of the burying layer. Conversely speaking, the burying layer has a lattice constant lower than that of the quantum dot.

Further, in the embodiments described hereinabove, the quantum dot is provided on a Ga polar face such that the region in which the quantum dot is provided and the region in which such quantum dots are juxtaposed in the vertical direction are converted into p type by a potential lifting effect by the Schottky barrier or the p-type semiconductor layer and the negative fixed charge at the substrate side. However, the p-type conversion is not limited to this, but only it is necessary to provide a quantum dot on a polar face. In this case, preferably the quantum dot is provided on a crystal face having a high polarity.

Figure 26:
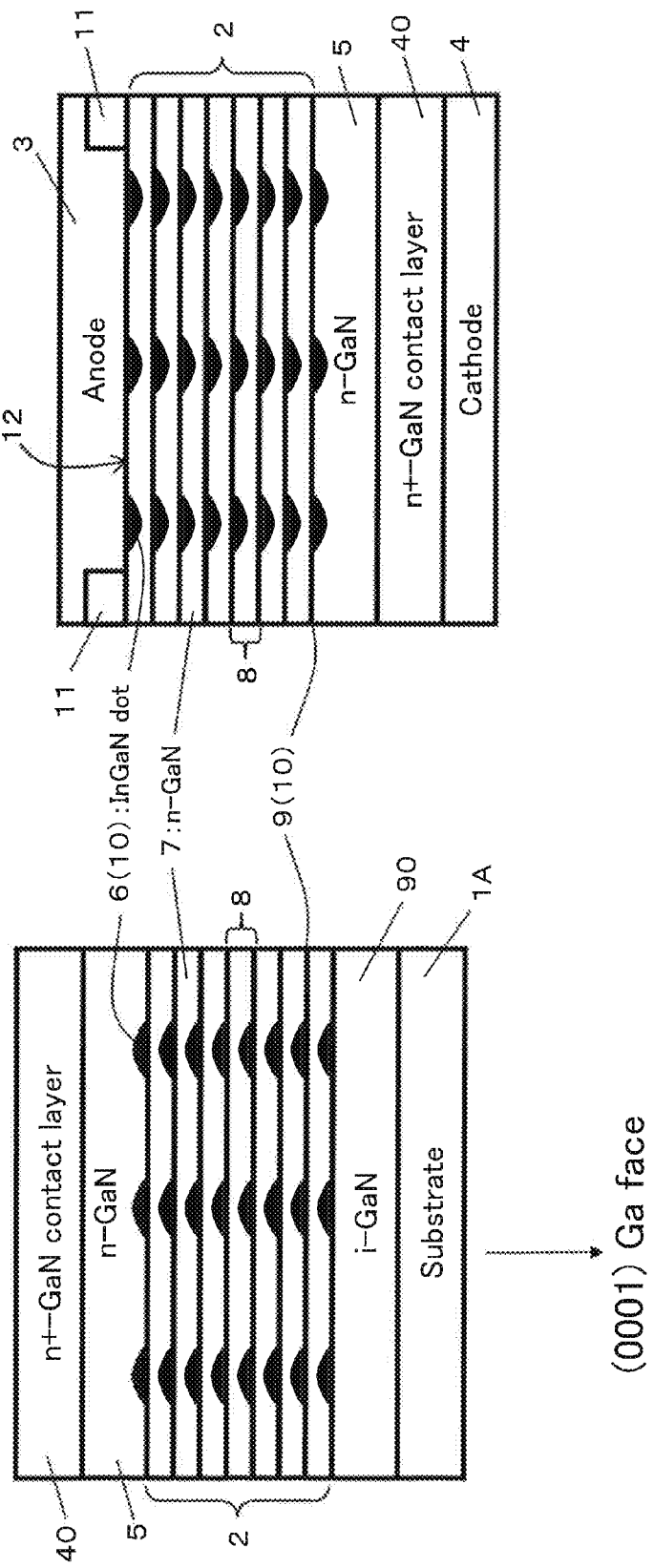
FIGS. 26A and 26B are schematic sectional views depicting a configuration of a semiconductor device according to the modification to the first embodiment and a fabrication method therefor.

For example, the quantum dot 6 may be provided on an N-polar face as depicted in FIG. 26A such that the region in which the quantum dot 6 is provided and the region in which such quantum dots 6 are juxtaposed in the vertical direction are converted into p type by a potential lifting effect by the Schottky barrier or the p-type semiconductor layer and the negative fixed charge at the substrate side.

Here, in order to configure a semiconductor device wherein a quantum dot 6 is provided on an N-polar face, an $n^+$-GaN (000-1) substrate 1A may be used as the n-type GaN substrate. In this case, the top face of the n-type GaN substrate 1A is a (000-1) face, namely, a crystal face having a plane orientation of (000-1). In short, the top face of the n-type GaN substrate 1A is an N face, namely, an N-polar face having an N element (chemical element) located on the surface thereof. In this case, the top face (upper surface) of an i-GaN layer 90 provided on the n-type GaN substrate 1A having an N-polar face on the top face thereof and the top faces (upper surfaces) of the plurality of n-type GaN burying layers 7 provided over the i-GaN layer 90 are N-polar faces. Therefore, the InGaN quantum dot 6 is provided on the N-polar face of the i-GaN layer 90 or the n-type GaN burying layer 7. Also in this case, the quantum dot 6 is provided on a polar face.

Such a semiconductor device wherein a quantum dot 6 is provided on an N-polar face as just described is fabricated, for example, in the following manner.

In particular, an i-GaN layer 90, an InGaN dot buried drift layer 2, an n-GaN buffer layer 5 and an $n^+$-GaN contact layer 40 are formed by crystal growth on an $n^+$-GaN (000-1) substrate 1A as depicted in FIG. 26A. Then, the $n^+$-GaN (000-1) substrate 1A and the i-GaN layer 90 are removed, and a SiN passivation film 11 is formed in such a manner as to cover the exposed surface of the InGaN dot buried drift layer 2 as depicted in FIG. 26B. Then, an opening is formed in the SiN passivation film 11 to expose the Schottky region 12, and then an anode electrode 3, for example, of TaN/Cu is formed, for example, by a sputtering method. Further, on the exposed surface of the $n^+$-GaN contact layer 40, a cathode electrode 4, for example, of Ti/Al is formed, for example, by a vapor deposition method. A semiconductor device wherein the quantum dot 6 is provided on an N-polar face can be fabricated in this manner. Here, the semiconductor device includes the n type GaN contact layer 40, n type GaN buffer layer 5, InGaN dot buried drift layer 2, anode electrode 3 and cathode electrode 4.

In this case, in the fabrication method for a semiconductor device described above, the step of forming the drift layer may include a step of forming a quantum dot containing $In_xGa_{1-x}N$ ($0 \leq x \leq 1$) on a polar face of a first semiconductor layer containing n-type $In_x(Ga_yAl_{1-y})_{1-x}N$ ($0 \leq x \leq 1, 0 \leq y \leq 1$), and another step of burying the quantum dot with a second semiconductor layer containing n-type $In_x(Ga_yAl_{1-y})_{1-x}N$ ($0 \leq x \leq 1, 0 \leq y \leq 1$).

Further, in the embodiments and the modifications described hereinabove, a quantum dot is provided on a polar face such that the region in which the quantum dot is provided and the region in which such quantum dots are juxtaposed in the vertical direction are converted into p type by a potential lifting effect by the Schottky barrier or the p-type semiconductor layer and the negative fixed charge at the substrate side. However, the p-type conversion is not limited to this. For example, the region in which a quantum dot is provided and besides the region in which such quantum dots are juxtaposed in the vertical direction may be converted into p type by providing the quantum dots on a non-polar face like, for example, an M face, namely, a (1-100) face or an A face, and doping a p-type impurity into the quantum dots. In particular, when a quantum dot is provided on a non-polar face, such fixed charge as in the embodiments and the modifications described hereinabove is not generated. Therefore, the region in which a quantum dot is provided and besides the region in which such quantum dots are juxtaposed in the vertical direction may be converted into p type by doping a p-type impurity into the quantum dots. In this manner, the region in which a quantum dot is provided and besides the region in which such quantum dots are juxtaposed in the vertical direction may be converted into p type by doping a p-type impurity into the quantum dots in place of converting the region in which a quantum dot is provided and besides the region in which such quantum dots are juxtaposed in the vertical direction into p type by providing the quantum dost on polar faces.

In this case, in the fabrication method for a semiconductor device described hereinabove, the step of forming the drift layer includes a step of forming a quantum dot containing $In_xGa_{1-x}N$ ($0 \leq x \leq 1$) and a p-type impurity on a first semiconductor layer containing n-type $In_x(Ga_yAl_{1-y})_{1-x}N$ ($0 \leq x \leq 1$, $0 \leq y \leq 1$), and another step of burying the quantum dot with a second semiconductor layer containing n-type $In_x(Ga_yAl_{1-y})_{1-x}N$ ($0 \leq x \leq 1$, $0 \leq y \leq 1$).

Further, while, in the embodiments and the modifications described hereinabove, the thickness of the drift layer is equal to or greater than approximately 0.1 μm, particularly equal to approximately 1 μm, the thickness of the drift layer is not limited to this. For example, the drift layer may be formed in with greater thickness.

Figure 27:
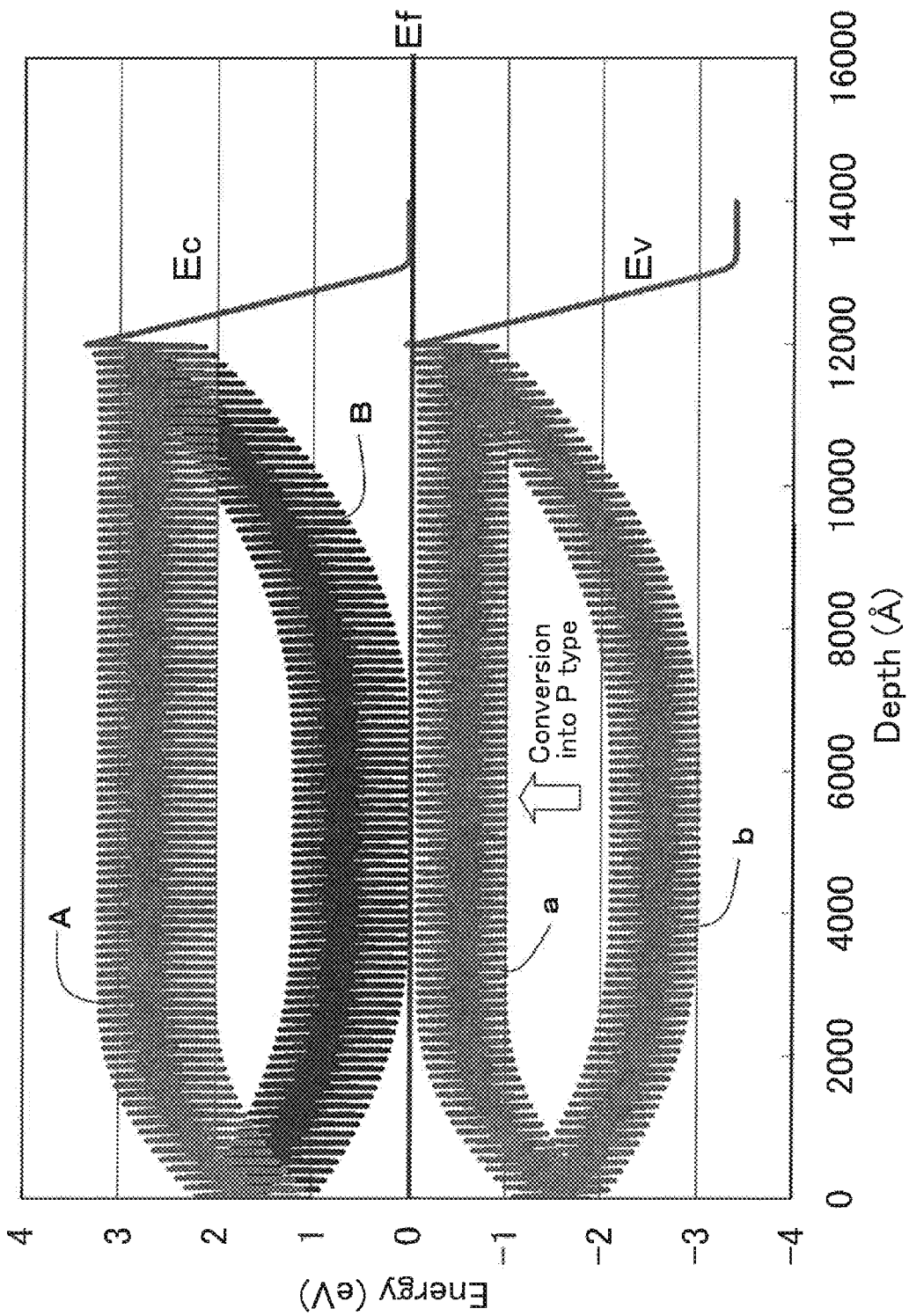
FIG. 27 is a band diagram illustrating a method of converting a region in which quantum dots are provided into p type when the thickness of a drift layer is to be increased in the semiconductor device according to the first embodiment.
Figure 28:
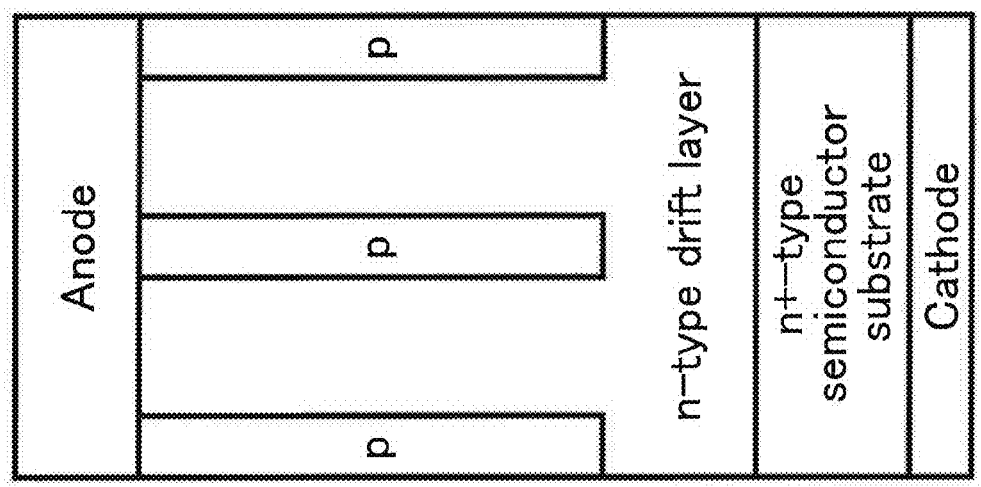
FIG. 28 is a schematic sectional view depicting a configuration of a Schottky barrier diode having a conventional super-junction type drift structure.

However, if the drift layer is excessively thick, then the potential lifting effect by the Schottky barrier or the p-type semiconductor layer and the negative charge at the substrate side does not reach an intermediate region in the thicknesswise direction of the drift layer. Therefore, the potential drops in this intermediate region and disturbs the p-type conversion. In this case, if a p-type impurity such as, for example, Mg and so forth is doped into the quantum dot, then even if the drift layer is thick, the p-type conversion occurs with certainty in the overall area of the drift layer. In particular, in the drift layer wherein a p-type impurity is not doped in a quantum dot (here, an InGaN quantum dot), the potential drops in an intermediate region in the thicknesswise direction of the drift layer as indicated by solid lines B and b in FIG. 27 and the p-type conversion does not occur. In contrast, in the drift layer wherein a p-type impurity is doped in a quantum dot (here, in an InGaN quantum dot), a region in which the InGaN quantum dots 6 are juxtaposed in the vertical direction is converted into p type in the overall area of the drift layer as indicated by solid lines A and a in FIG. 27. It is to be noted that the solid lines A and B indicate energy Ec at the lower end of the conduction band, and the solid lines a and b indicate energy Ev at the upper end of the valence band. Further, in FIG. 27, the horizontal axis indicates the distance from the interface between the anode electrode and the InGaN quantum dot at the side nearest to the front face.

In this manner, by providing a quantum dot on a polar face as in the embodiments and the modifications described hereinabove, the region in which the quantum dot is provided and besides the region in which such quantum dots are juxtaposed in the vertical direction are converted into p type, and besides, by doping a p-type impurity into the quantum dot, the effect of the p-type conversion can be raised further. It is to be noted that, also where the thickness of the drift layer is not great, for example, also where such a thickness as in any of the embodiments and the modifications described hereinabove is adopted, the region in which the quantum dot is provided and besides the region in which such quantum dots are juxtaposed in the vertical direction may be converted into p type by providing the quantum dots on the polar faces and besides doping a p-type impurity into the quantum dots. In this case, in the fabrication method for a semiconductor device described hereinabove, the step of forming the drift layer includes a step of forming a quantum dot containing $In_xGa_{1-x}N$ ($0 \leq x \leq 1$) and a p-type impurity on a polar face of a first semiconductor layer containing n-type $In_x(Ga_yAl_{1-y})_{1-x}N$ ($0 \leq x \leq 1$, $0 \leq y \leq 1$), and another step of burying the quantum dot with a second semiconductor layer containing n-type $In_x(Ga_yAl_{1-y})_{1-x}N$ ($0 \leq x \leq 1$, $0 \leq y \leq 1$).

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:

1. A semiconductor device, comprising:
   a drift layer having a structure wherein a plurality of quantum dot layers each including a quantum dot containing $In_xGa_{1-x}N$ ($0 \leq x \leq 1$) and a burying layer burying the quantum dot and containing n-type $In_x(Ga_yAl_{1-y})_{1-x}N$ ($0 \leq x \leq 1$, $0 \leq y \leq 1$) are stacked, a region in which the quantum dots are juxtaposed in a vertical direction in the burying layers of n-type included in the plurality of quantum dot layers being converted into p type.

2. The semiconductor device according to claim 1, wherein the quantum dot is provided on a polar face.

3. The semiconductor device according to claim 1, wherein a p-type impurity is doped in the quantum dot.

4. The semiconductor device according to claim 1, further comprising an anode electrode joined to the drift layer by Schottky junction.

5. The semiconductor device according to claim 1, further comprising a p-type semiconductor layer contacting with the drift layer.

6. The semiconductor device according to claim 1, further comprising:
   an anode electrode joined to the drift layer by Schottky junction; and
   a p-type semiconductor layer contacting with the drift layer.

7. The semiconductor device according to claim 4, further comprising:
   a substrate provided at the opposite side to one side of the drift layer at which the anode electrode is provided; and
   a cathode electrode provided at the opposite side to one side of the substrate at which the drift layer is provided.

8. The semiconductor device according to claim 4, further comprising:
   a contact layer provided at the opposite side to one side of the drift layer at which the anode electrode is provide; and
   a cathode electrode provided at the opposite side to one side of the contact layer at which the drift layer is provided.

9. The semiconductor device according to claim 4, further comprising:
   a contact layer provided at the opposite side to one side of the drift layer at which the anode electrode is provided;
   a substrate provided at the opposite side to one side of the contact layer at which the drift layer is provided;
   a via hole provided at the substrate;
   a cathode electrode provided at the via hole; and
   a via interconnection provided at the via hole and electrically connected to the cathode electrode.

10. The semiconductor device according to claim 5, further comprising:
    a source electrode provided at the opposite side to one side of the p-type semiconductor layer at which the drift layer is provided;
    a substrate provided at the opposite side to one side of the drift layer at which the p-type semiconductor layer is provided; and
    a drain electrode provided at the opposite side to one side of the substrate at which the drift layer is provided.

11. The semiconductor device according to claim 5, further comprising:

a source electrode provided at the opposite side to one side of the p-type semiconductor layer at which the drift layer is provided;

a contact layer provided at the opposite side to one side of the drift layer at which the p-type semiconductor layer is provided; and a drain electrode provided at the opposite side to one side of the contact layer at which the drift layer is provided.

12. The semiconductor device according to claim 5, further comprising:

a source electrode provided at the opposite side to one side of the p-type semiconductor layer at which the drift layer is provided;

a contact layer provided at the opposite side to one side of the drift layer at which the p-type semiconductor layer is provided;

a substrate provided at the opposite side to one side of the contact layer at which the drift layer is provided;

a via hole provided at the substrate;

a drain electrode provided at the via hole; and a via interconnection provided at the via hole and electrically connected to the drain electrode.

13. The semiconductor device according to claim 1, wherein the quantum dot contains $In_xGa_{1-x}N$ ($0 \leq x \leq 1$).

14. The semiconductor device according to claim 1, wherein the quantum dot contains GaN; and the burying layer contains AlGaN.

15. A power supply apparatus, comprising:

a semiconductor device; wherein the semiconductor device includes a drift layer having a structure wherein a plurality of quantum dot layers each including a quantum dot containing $In_xGa_{1-x}N$ ($0 \leq x \leq 1$) and a burying layer burying the quantum dot and containing n-type $In_x(Ga_yAl_{1-y})_{1-x}N$ ($0 \leq x \leq 1$, $0 \leq y \leq 1$) are stacked, a region in which the quantum dots are juxtaposed in a vertical direction in the burying layers of n-type included in the plurality of quantum dot layers being converted into p type.

16. A fabrication method for a semiconductor device, comprising:

forming a drift layer by stacking a plurality of quantum dot layers each including a quantum dot containing $In_xGa_{1-x}N$ ($0 \leq x \leq 1$) and a burying layer burying the quantum dot and containing n-type $In_x(Ga_yAl_{1-y})_{1-x}N$ ($0 \leq x \leq 1$, $0 \leq S \leq 1$), a region in which the quantum dots are juxtaposed in a vertical direction in the burying layers of n-type included in the plurality of quantum dot layers being converted into p type.

17. The fabrication method for a semiconductor device according to claim 16, wherein the forming of the drift layer includes:

forming a quantum dot containing $In_xGa_{1-x}N$ ($0 \leq x \leq 1$) on a polar face of a first semiconductor layer containing n-type $In_x(Ga_yAl_{1-y})_{1-x}N$ ($0 \leq x \leq 1$, $0 \leq y \leq 1$); and burying the quantum dot with a second semiconductor layer containing n-type $In_x(Ga_yAl_{1-y})_{1-x}N$ ($0 \leq x \leq 1$, $0 \leq y \leq 1$).

18. The fabrication method for a semiconductor device according to claim 16, wherein the forming of the drift layer includes:

forming a quantum dot containing $In_xGa_{1-x}N$ ($0 \leq x \leq 1$) and a p-type impurity on a first semiconductor layer containing n-type $In_x(Ga_yAl_{1-y})_{1-x}N$ ($0 \leq x \leq 1$, $0 \leq y \leq 1$); and burying the quantum dot with a second semiconductor layer containing n-type $In_x(Ga_yAl_{1-y})_{1-x}N$ ($0 \leq x \leq 1$, $0 \leq y \leq 1$).

19. The fabrication method for a semiconductor device according to claim 16, further comprising, after the forming of the drift layer, forming an anode electrode joined to the drift layer by Schottky junction.

20. The fabrication method for a semiconductor device according to claim 16, further comprising, after the forming of the drift layer, forming a p-type semiconductor layer contacting with the drift layer.

* * * * *